United States Patent
Chiang et al.

(10) Patent No.: US 6,231,779 B1
(45) Date of Patent: May 15, 2001

(54) PIEZOELECTRIC ACTUATORS AND METHOD OF MAKING SAME

(75) Inventors: Yet-Ming Chiang, Framingham; Gregory W. Farrey, Somerville; Nesbitt W. Hagood, IV, Wellesley; Andrey Soukhojak; Haifeng Wang, both of Somerville, all of MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/174,981

(22) Filed: Oct. 19, 1998

Related U.S. Application Data

(60) Provisional application No. 60/085,109, filed on May 12, 1998, and provisional application No. 60/062,531, filed on Oct. 20, 1997.

(51) Int. Cl.$^7$ .................................................. C04B 35/453

(52) U.S. Cl. ................... 252/62.9 R; 252/62.9 PZ; 501/134; 501/135; 501/136; 501/139; 310/367; 310/357; 310/358; 117/63; 117/448; 117/449; 117/450

(58) Field of Search .................. 252/62.9 PZ, 62.9 R; 501/134, 135, 136, 139; 423/598, 599, 593, 600; 117/948, 949, 950, 63; 310/367, 358, 357

(56) References Cited

U.S. PATENT DOCUMENTS

| | | | |
|---|---|---|---|
| 3,994,823 | * 11/1976 | Ainger et al. | 252/62.9 PZ |
| 5,423,995 | 6/1995 | Helke et al. | 252/62.9 |
| 5,500,142 | 3/1996 | Ushida et al. | 252/62.9 |
| 5,527,480 | 6/1996 | Bailey et al. | 252/62.9 |
| 5,637,542 | 6/1997 | Takenaka | 501/134 |
| 5,648,012 | 7/1997 | Higashibeppu et al. | 252/62.9 |
| 5,796,207 | 8/1998 | Safari et al. | 310/358 |
| 6,004,474 | 12/1999 | Takenaka et al. | 252/62.9 R |
| 6,080,327 | 6/2000 | Takenaka et al. | 252/62.9 R |

OTHER PUBLICATIONS

Takenaka et al,"(Bi1/2Na1/2)TiO3–BaTiO3 System for Lead–Free Piezoelectric Ceramics", Jap. J. App. Phy., vol. 30 (9B), pp. 2236–2239, Sep. 1991.*

Takenaka et al,"Acoustic Wave Characteristics of Lead–Free (Bi1/2Na1/2)0.99Ca0.01TiO3 Piezoelectric Ceramic", J. Appl. Phys. Suppl., vol. 28, pp. 59–62, 1992.*

Takenaka et al,"Piezoelectric Ceramics of (Bi1/2Na1/2)TiO3–PbTiO3–BaTiO3 System", Elect. Eng. Japan, vol. 112(7), pp. 92–100, 1992.*

Sakata et al, "Ferroelectric and Anitferroelectric Properties of (Na0.5Bi0.5)TiO3–SrTiO3 Solid Solution Ceramics", Ferroelectrics, vol. 7, pp. 347–349, 1974.*

Bergman et al., "Phase Diagram For $K_2O$–$Na_2O$–$B_2O_3$–$P_2O_5$," Reported in *Russ. J. Inorg. Chem.* 14(7):1036–1038 (1969) [abstract only]. no month.

(List continued on next page.)

*Primary Examiner*—C. Melissa Koslow
(74) *Attorney, Agent, or Firm*—Clark & Elbing LLP; Mary Rose Scozzafava

(57) ABSTRACT

A single crystal perovskite material is provided having the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Tb, Dy, Ho, Er, Tm, Yb and Lu; and M" is one or more of Ti, Zr, Hf, Sn, Ge, Mg, Zn, Al, Sc, Ga, Nb, Mo, Sb, Ta and W; where $z \leq 0.1$; $0.9 \leq \delta \leq 1.1$; $\alpha$, $\beta$ and $\gamma$ are greater than zero; and ($\alpha+\beta+\gamma$) is in the range of about 0.75 to 1.1. A perovskite material of the formula, $Na_\omega M_\alpha Bi_\beta M'_\gamma M''_\delta O_{3\pm z}$, is provided where M is one or more of K, Rb and Cs; M' is one or more of Ca, Sr, Ba, Pb, Y, La, Pr, Nd, Sm, Eu, Gd, Tb, Dy, Ho, Er, Tm, Yb and Lu; M" is one or more of Ti, Zr, Hf, Sn, Ge, Mg, Zn, Al, Sc, Ga, Nb, Mo, Sb, Ta and W; where $z \leq 0.1$; $0.9 \leq \delta \leq 1.1$; $\alpha$, $\beta$ and $\gamma$ are greater than zero; and ($\alpha+\beta+\gamma$) is in the range of about 0.75 to 1.1. The materials exhibit improved $d_{33}$ and piezoelectric strain values, as well as low hysteresis.

41 Claims, 23 Drawing Sheets

OTHER PUBLICATIONS

Kuwata et al., "Dielectric and Piezoelectric Properties of $0.91Pb(Zn_{1/3}Nb_{2/3})O_3$–$0.09PbTiO_3$ Single Crystals" *Japanese Journal of Applied Physics* 21(9):1298–1302 (1982). no month.

Manier et al., "$Na_{0.5}Bi_{0.5}TiO_3$ (NBT–KBT) System: A Structural and Electrical Study" *Phys. Stat. Sol.* 157:499–506 (1996). no month.

Park and Shrout, "Ultrahigh Strain and Piezoelectric Behavior in Relaxor Based Ferroelectric Single Crystals" *J. Appl. Phys.* 82:1804–1811 (1997). no month.

Park and Chung, "Nonstoichiometry and the Long–Range Cation Ordering in Crystals of $(Na_{1/2}Bi_{1/2})TiO_3$" *J. Am. Ceram. Soc.* 77(10):2641–47 (1994). no month.

Pronin et al., "Peculiarities of Phase Transitions in Sodium–Bismuth Titanate" *Ferroelectrics* 25:395–397 (1980). no month.

Roleder et al., "Time Dependence of Electric Permittivity in $Na_{0.5}TiO_3$ Single Crystals" *Ferroelectrics* 89:1–5 (1989). no month.

Sakata, "Ferroelectric and Antiferroelectric Properties of $(Na_{0.5}Bi_{0.5})TiO_3$–$SrTiO_3$ Solid Solution Ceramics" *Ferroelectrics* 7:347–349 (1974). no month.

Service, "Shape–Changing Crystals Get Shiftier" *Science* 275:1877–1878 (1997). no month.

Smolenskii et al., "New Ferroelectrics of Complex Composition.IV" *Sov. Phys. Solid State* 2(11):2651–2654 (1961). no month.

Takenaka et al., "Acoustic Wave Characteristics of Lead–Free $(Bi_{1/2}Na_{1/2})_{0.99}Ca_{0.01}TiO_3$ Piezoelectric Ceramic" *J. Appl. Phys. Suppl.* 28:59–62 (1989). no month.

Takenaka et al., "Mechanical Properties of $(Bi_{1/2}Na_{1/2})TiO_3$–based Piezoelectric Ceramics" *Silicates Industries* 7–8:136–142 (1993). no month.

Takenaka et al., "Piezoelectric Ceramics of $(Bi_{1/2}Na_{1/2})TiO_3$–$PbTiO_3$ System" *Electrical Engineering in Japan* 112:92–100 (1992). no month.

Takenaka et al., "$(Bi_{1/2}Na_{1/2})TiO_3$–$BaTiO_3$ System for Lead–Free Piezoelectric Ceramics" *Japanese Journal of Applied Physics* 30(93):2236–2239 (1991). no month.

Vakhrushev et al., "Investigation of a Broad Phase Transition in $Na_{0.5}Bi_{0.5}TiO_3$ By the Neutron Scattering Method" *Solid State* 27(3):455–457 (1985). no month.

Wang et al., "Phase Diagram of $K_{0.5}Bi_{0.5}TiO_3$–$Na_{0.5}TiO_3$" *Guisuanyan Xuebao* 15(3):248–255 (1987). no month.

\* cited by examiner

US 6,231,779 B1

PIEZOELECTRIC ACTUATORS AND METHOD OF MAKING SAME

This application claims benefit of priority of U.S. Provisional Patent Application Nos. 60/085,109, filed May 12, 1998, and 60/062,531, filed Oct. 20, 1997, both of which are incorporated herein by reference.

This invention was made with government support under Grant Number N00014-97-0989 awarded by the Office of Naval Research. The government has certain rights in the invention.

FIELD OF THE INVENTION

This invention relates to a class of lead-free or low lead perovskite structure oxide compounds useful as piezoelectric actuators and composite actuators utilizing these compounds in the form of oriented polycrystals or crystallites. The invention relates to compositions exhibiting improved strain coefficients, strain actuation and other properties relating to piezoelectric performance. The invention also relates to a method of making a piezoelectric device which incorporates oriented crystallites.

BACKGROUND OF THE INVENTION

Piezoelectric materials respond to the application of stress by generating electrical polarization in the crystal, and generate a strain upon application of electric field. The magnitude of the piezoelectric effect is measured, in part, by its piezoelectric coefficient $d_{ab}$ which is a measure of the strain in the material due to the application of a unit electric field and the electromechanical coupling constant $k_{ab}$, the square of which is a measure of the efficiency of electromechanical energy conversion. The subscript α denotes the direction in which the field is applied and the subscript b denotes the direction of the measured actuation. The widely used $Pb_xZr_{1-x}TiO_3$ (PZT) family of piezoelectric actuators typically show $d_{33}$=200–700 pC/N, maximum strains before dielectric breakdown of 0.3% and maximum electromechanical coupling coefficients of $k_{33}$~80%.

Single crystal ferroelectric perovskite compounds such as $Pb_xMg_{1-x}Nb_yTi_{1-y}O_3$ (PMN-PT) and $Pb_xZn_{1-x}Nb_yTi_{1-y}O_3$ (PZN-PT) have recently been shown to have unusually good performance as piezoelectric actuators, with strain coefficients $d_{33}$ of up to 2500 pC/N, maximum strains of 1.5%, and electrochemical coupling coefficients of $k_{33}$=94%. See, Kawata et al., Jap. J. Appl. Phys. 21:1298 (1982). The piezoelectric properties are superior to those of PZT. The PMN-PT and PZN-PT compositions appear to be much easier to grow as single crystals than many other perovskites, including PZT.

At room temperature, these single crystal actuators form the perovskite structure in a phase of rhombohedral symmetry. They exhibit these superior properties only when they are actuated out of the spontaneous polarization direction, which is <111> when referred to the crystal axes of the corresponding cubic perovskite. The highest actuation to date appears to have been observed when the crystals are actuated with the applied field parallel to the <100> direction of the corresponding cubic perovskite.

A drawback to all these lead-based perovskites is the toxicity of lead and associated difficulties in processing, crystal growth and handling. In certain environmentally sensitive or biologically sensitive applications, they can not be used. Another drawback is the high density and relatively low elastic modulus of the lead-based perovskites. For applications where toxicity or weight-based measures of performance are important, alternative materials are desired.

$(Na_{1/2}Bi_{1/2})TiO_3$ (NBT) and $(K_{1/2}Bi_{1/2})TiO_3$ (KBT) are known to crystallize in the perovskite crystal structure. See, Smolenskii et al., Soviet Phys. Solid State 2(11):2651 (May, 1961) and Roleder et al., Ferroelectrics 89:1 (1989). At room temperature, NBT is a rhombohedral ferroelectric with a Curie temperature of 320° C. Undoped BNT has been grown as single crystals, and the structure and phase transitions as a function of temperature have been studied; however, the piezoelectric properties of the single crystal are not known and it has not been used as a piezoelectric actuator.

$(Na_{1/2}Bi_{1/2})TiO_3$ has also been alloyed with alkaline earth titanates. Polycrystalline materials in the $(Na_{1/2}Bi_{1/2})TiO_3$—$M'TiO_3$ (M'=Ca, Sr, Ba, Pb) systems have been previously studied. See, Takenaka et al. Ferroelectrics 7:347 (1974); and Jap. J. Appl. Phys. 30(9B):2236 (1991). In all these doped materials, the modest values of $d_{33}$ and $k_{33}$ make them of relatively limited interest for piezoelectric actuation, when compared with materials such as PZT.

Takenaka et al. reports the alloying of $(Na_{1/2}Bi_{1/2})TiO_3$ with $BaTiO_3$ (Jap. J. Appl. Phys. 30(9B):2236 (1991)) or $PbTiO_3$ (Elec. Eng. Japan 112(7):92 (September 1992)). The compounds exhibit a morphotropic phase boundary (MPB) between rhombohedral (ferroelectric) and tetragonal (ferroelectric) phases at approximately 6 molar % and 13.5 molar % of the additive, respectively, at 20° C. Near the morphotropic phase boundary, $d_{33}$ values of approximately 125 pC/N and $k_{33}$ of about 55% have been reported.

For $(Na_{1/2}Bi_{1/2})TiO_3$ alloyed with $CaTiO_3$, the morphotropic phase boundary between rhombohedral (ferroelectric) and cubic (paraelectric) phases lies at approximately 17% at 20° C., and a 10% composition shows $d_{33}$ values of approximately 50 pC/N and $k_{33}$ of about 38%. See, Takenaka et al. Japan. J. Appl. Phys., 28:59 (1989).

$(Na_{1/2}Bi_{1/2})TiO_3$ alloyed with $SrTiO_3$ shows a more complicated sequence of phases with increasing Sr concentration. A rhombohedral phase (antiferroelectric) phase intervenes between the rhombohedral (ferroelectric) and cubic (paraelectric) endmembers. Some mixed substitutions such as those between NBT and $(Pb,Ba)TiO_3$ and $(Pb,Sr)TiO_3$ have also been characterized and show, near the morphotropic phase boundary (MPB) between rhombohedral (ferroelectric) and tetragonal (ferroelectric) phases, $d_{33}$ 125= pC/N and $k_{33}$=55%. See, Takenaka et al. Ferroelectrics 7:347 (1974).

While the intrinsic electromechanical properties of properly oriented single crystals appear to be attractive, there are numerous obstacles to their practical implementation. Firstly, the growth, orientation, cutting and handling of large single crystals is expensive and difficult For example, a typical method of single crystal growth is the Czochmalski method in which a crystal may take days to grow. Special precautions in crystal growth may have to be taken for compounds that contain toxic and volatile components, such as lead oxide. Secondly, ceramic ferroelectrics are mechanically brittle and weak, more so than other ceramics such as aluminum oxide, silicon nitride or silicon carbide. The act of electrical actuation can be sufficient to cause fracture in a single crystal actuator. Oxide ceramics can usually tolerate not more than 0.1% elastic strain before fracturing. Since the field-induced strain of single crystal piezoelectrics exceeds 0.3% and may be as high as 1.5%, any differential strain across a crystal which is in excess of the elastic strain-to-failure can cause fracture. Thus, a single crystal actuator must have high crystalline perfection. If there are inclusions within the crystal, these can be hard centers of dilation which do not deform when the surrounding crystal is actuated and can act as critical flaws causing fracture.

Polycrystalline materials are more tolerant of crystalline defects and are easier to manufacture. Nonetheless, a conventional polycrystalline ferroelectric, electrostrictive or magnetostrictive actuator suffers in performance relative to an optimally oriented single crystal. One reason is that randomly oriented crystallites can not simultaneously be oriented with respect to an applied field so as to optimize the intrinsically anisotropic crystal properties in each grain. Another reason is that each single crystal grain undergoes anisotropic crystal deformation under the applied field and so works against its neighbors. This limits the net strain which is achievable from a polycrystalline actuator material.

If the majority of the grains in a polycrystal are textured, that is, share one or more common crystallographic directions, the electromagnetic properties can approach those of a single crystal. However, it is well-known to those skilled in the art that polycrystalline ceramics are difficult to prepare in a textured form. Ceramics which tend to grow grains with an anisotropic platelet shape, such as micaceous minerals or the Bi—Sr—Ca—Cu—O superconducting compound, or a needle-like shape, such as certain magnetic oxides, can sometimes be prepared in an aligned form by deformation and/or recrystallization of an initial isotropic grain or by applying a high electric or magnetic field. Systems with isotropic grain and crystallite shapes, which include the perovskites of interest, are much harder to align. While oriented polycrystalline perovskite ferroelectrics have been accomplished in the form of thin films supported by a substrate they have not been achieved in polycrystals suitable for actuation devices.

It is an object of the present invention to provide perovskite compounds which are low in lead or lead-free and which can be grown as single crystals for use as piezoelectric materials.

It is a further object of the invention to provide perovskite compounds of rhombohedral, tetragonal and other phase symmetries for use in piezoelectric actuators that have useful piezoelectric actuation properties.

It is a further object of the invention to provide perovskite compounds which are low in lead or lead-free and which have superior piezoelectric properties, such as improved strain coefficients, low hysteresis piezoelectric actuation, improved coupling constant and/or improved actuation strain.

It is still a further object of the invention to develop actuation methods which exploit the inherent anisotropic properties of the crystal.

It is still a further object of the invention to provide methods for fabricating a piezoelectric device, such that intrinsically anisotropic properties of the single crystal can be utilized without growing large single crystals.

Yet a further object of the invention is to provide a piezoelectric composite device which provides the advantages of anisotropic properties of large single crystal materials without the need to use said large crystals.

SUMMARY OF THE INVENTION

In accordance with the invention there are provided single crystal and polycrystalline materials of a broad family of alkali metal bismuth perovskite compositions which demonstrate surprisingly unexpected piezoelectric properties.

In one aspect of the invention, a single crystal perovskite material is provided having the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Tb, Dy, Ho, Er, Tm, Yb and Lu; and M" is one or more of Ti, Zr, Hf, Sn, Ge, Mg, Zn, Al, Sc, Ga, Nb, Mo, Sb, Ta and W; and where $z \leq 0.1$; $0.9 \leq \delta \leq 1.1$; $\alpha$, $\beta$ and $\gamma$ are greater than zero; and $(\alpha+\beta+\gamma)$ is in the range of about 0.75 to 1.1, or preferably in the range of 0.75 to 0.95

In another aspect of the invention, a piezoelectric perovskite material is provided having the formula, $Na_\omega M_\alpha Bi_\beta M'_\gamma M''_\delta O_{3\pm z}$, where M is one or more of K, Rb and Cs; M' is one or more of Ca, Sr, Ba, Pb, Y, La, Pr, Nd, Sm, Eu, Gd, Tb, Dy, Ho, Er, Tm, Yb and Lu; M" is one or more of Ti, Zr, Hf, Sn, Ge, Mg, Zn, Al, Sc, Ga, Nb, Mo, Sb, Ta and W; where $z \leq 0.1$; $0.9 \leq \delta \leq 1.1$; $\alpha$, $\beta$, $\gamma$ and $\omega$ are greater than zero; and $(\alpha+\beta+\gamma+\omega)$ is in the range of about 0.75 to 1.1, preferably in the range of 0.75 to 0.95.

In preferred embodiments, the material may exhibit superior piezoelectric properties such as a $d_{33}$ value of greater than 200 pC/N, a piezoelectric strain of greater than 0.15% and/or low hysteresis of actuation. For the purpose of the invention, "low hysteresis" is defined with respect to a plot of the longitudinal strain of the piezoelectric material against the applied electric field. As the field is varied repeatedly at low frequency (e.g., less than 100 Hz) between a lower limit $E_1$ and an upper limit $E_2$, where $E_1$ and $E_2$ have the same sign, the strain varies between the limits $\epsilon_1$ and $\epsilon_2$. Low hysteresis is defined as the instance where the area between the increasing field and the decreasing field portions of the strain curve is less than about 25% of the total area under the strain curve measured upon increasing the absolute value of the field between the limits $E_1$ and $E_2$. The material may also exhibit an electric field-forced phase transition from an antiferroelectric to a ferroelectric phase, with an accompanying strain of at least 0.1%.

It is desirable to obtain single crystalline materials near the morphotropic phase boundary or point in the $M_\alpha Bi_\beta M'_\gamma M''_\delta O_{3\pm z}$ and $Na_\omega M_\alpha Bi_\beta M'_\gamma M''_\delta O_{3\pm z}$ systems to maximize the electrical properties of the material. By "morphotropic phase boundary" or MPB as that term is used herein it is meant a boundary between two perovskite phases of different crystal symmetry, at least one of which is ferroelectric or antiferroelectric. By "morphotropic phase point" or MPP as that term is used herein it is meant a point between three perovskite symmetry phases, at least one of which is ferroelectric or antiferroelectric. By "near" an MPB or MPP as that term is used it is meant that any of the parameters $\alpha$, $\beta$, $\gamma$, $\delta$, and/ $\omega$ are within 3 mol % of a MPB or MPP.

The material is preferably utilized as a single crystal or crystallite. By "crystallite" as that term is used herein, it is meant a single crystal having dimensions or proportions that are smaller than those of crystals grown from single crystal growth techniques such as the Czochralski method or Bridgeman method. Typical crystallites are on the order of about 0.1 mm to greater than 5 mm. The material may be a single crystal fiber, and may exhibit congruent melting. The material may be characterized by a supercell lattice with twice the dimensions of the perovskite cell, in which the A-site cations are arranged to have primitive or body-centered symmetry.

This class of single crystal piezoelectrics demonstrates improved mechanical reliability as well as useful actuation properties. In particular, this family of materials demonstrates a rhombohedral phase material with low hysteresis piezoelectric actuation and/or large piezoelectric strain coefficient $d_{33}$. The invention also provides a tetragonal phase material having exceptionally high piezoelectric strains, as well as heretofore unreported large $d_{33}$ values. Compositions are reported with strains as high as 0.85%.

In another aspect of the invention, a tetragonal perovskite piezoelectric material of the formula $M_\alpha Bi_\beta M'_\gamma M''_\delta O_{3\pm z}$, where M is one or more of Na, K, Rb, and Cs; M' is one or more of Ca, Sr, Ba, Pb, Y, La, Pr, Nd, Sm, Eu, Gd, Th, Dy, Ho, Er, Tm, Yb and Lu; M" is one or more of Ti, Zr, Hf, Sn, Ge, Mg, Zn, Al, Sc, Ga, Nb, Mo, Sb, Ta and W; and where z is less than or equal to 0.1, $\alpha+\beta+\gamma+\delta<2.0$, $\alpha$ is greater $\beta$ and $\beta$ is less than 0.5. In preferred embodiments, M is Na and/or K; M' is Ba and M" is Ti, and $\alpha+\beta+\gamma$ is in the range of about 0.75 to 0.95. In a preferred embodiment, Ba is present in an amount in the range of about 5.0 to about 6.25%, such that $\gamma$ is in the range of about 0.05–0.0625. In other preferred embodiments, M' is an alkaline earth metal and M" is Ti, and the M/Bi molar ratio is less than one and the (M+Bi+M')/M" molar ratio is less than one. In other preferred embodiments, the M/Bi ratio is less than about 0.94 and the (M+Bi+M')/M" molar ratio is less than about 0.90.

In another aspect, the invention provides methods of actuating tetragonal phase perovskite piezoelectric materials, by applying an electric field to a single crystal in a direction out of the spontaneous polarization direction of {100}. For example, the direction may be <111> or <110> of the corresponding cubic phase.

In yet another aspect, the invention provides methods of preparing oriented arrays of crystals, which include growing piezoelectric crystals or crystallites in a faceted morphology, and aligning a set of facets and/or edges of the crystals to crystallites to produce a textured array. These methods may be applied to the inventive compositions described herein, and/or to lead-containing perovskites or materials containing perovskite relaxor compounds. The crystals or crystallites may be grown, for example, in a flux liquid.

Further provided are devices comprising textured arrays of crystals or crystallites in a matrix. The texture may be uniaxial, biaxial, or triaxial. Devices according to this aspect of the invention may comprise one or more single crystal piezoelectric fibers secured in an appropriate matrix.

The invention provides advantages for a very broad range of applications where piezoelectric actuators are presently used, including but not limited to sonar transducers, piezoelectric motors, surface acoustics wave (SAW) devices, ultrasonic devices, passive and active structural composites for applications from sporting goods to aircraft and motorcraft, acoustic dampening composites, positioning devices for manufacturing and scanning probe microscopes, printer devices, and other suitable actuation applications.

BRIEF DESCRIPTION OF THE DRAWING

The invention is described with reference to the drawings, which are presented for the purpose of illustration only and which are in no way intended to be limiting of the invention and in which.

DETAILED DESCRIPTION OF THE INVENTION

Figure 1:
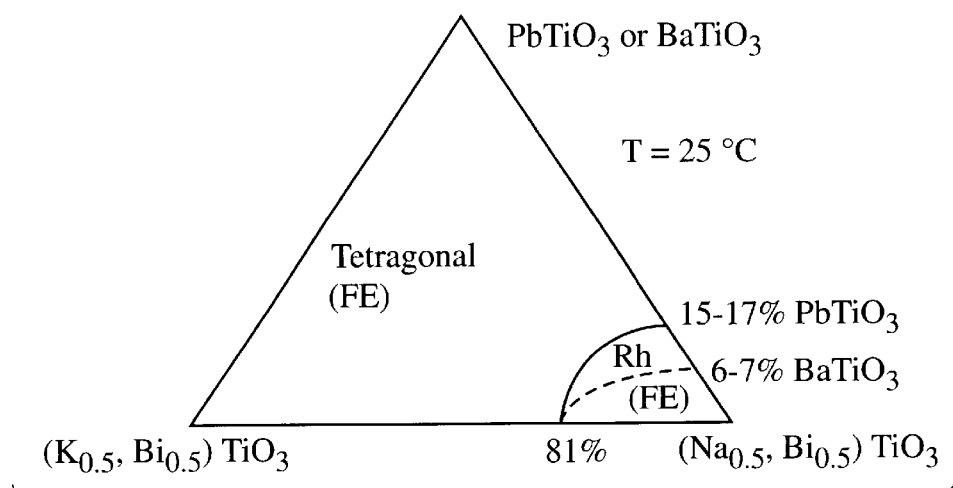
FIG. 1 is a schematic ternary phase diagram for the $PbTiO_3$ or $BaTiO_3$—$(K_{1/2}Bi_{1/2})TiO_3$—$(Na_{1/2}Bi_{1/2})TiO_3$ system at 25° C.

Rhombohedral and tetragonal single crystals with improved piezoelectric performance.

In one aspect of the invention, single crystal forms of the alkali metal bismuth titanate-alkaline earth titanate (MBiTiO$_3$—M'TiO$_3$) solid solution system are provided. MM'BiTiO$_3$ can form the desired perovskite crystal structure when doped with alkaline earth titanates, the alkaline earth substituting at the A-sites of the perovskite lattice structure, where the A-site is defined as that cation site which is 12-fold coordinated by oxygen.

In accordance with the invention, it is recognized that it can be desirable to substitute elements such as Ca, Sr, Ba, Pb, Y, La, Pr, Nd, Sm, Eu, Gd, Tb, Dy, Ho, Er, Tm, Yb and Lu, in the family of compositions of the invention at the A-site of the perovskite, for the purposes of increasing the dielectric strain coefficient or increasing the piezoelectric constant of the composition. These substitutions change the properties of the crystal by increasing the average ion polarizability on the site where they substitute and/or by changing the relative stability of the various perovskite phases by virtue of their size or polarizability.

Also in accordance with the invention, it is recognized it can be desirable to substitute elements such as Zr or Hf, Sn, Ge, Mg, Zn, Al, Sc, Ga, Nb, Mo, Sb, Ta and W for Ti in the family of compositions of the invention, for the purposes of increasing the dielectric constant or increasing the piezoelectric strain coefficient of the composition. These substitutions change the properties of the crystal by increasing the average ion polarizability on the site where they substitute and/or by changing the relative stability of the various perovskite phases by virtue of their size or polarizability.

In a preferred embodiment, single crystallites of the solid solution M$_\alpha$Bi$_\beta$M'$_\gamma$M"$_\delta$O$_{3\pm z}$ are provided. The crystallites appear as faceted crystals with certain crystal planes exposed. The crystallites are preferably the Wulff shape of the crystal, which is the shape preferred in order to minimize the surface energy of the crystal, but may also be shape determined by growth kinetics. In preferred embodiments, the perovskite crystals have a cubic shape such that each face is a {100} plane of the corresponding cubic phase. The crystallites vary in size from about 0.1 mm to greater than 5 mm, but in any case are smaller than the monolith single crystals grown from conventional single crystal growth techniques such as Bridgeman growth or the Czochralski method. Crystallites are obtained as described hereinbelow.

In another preferred embodiment, textured or oriented polycrystals are provided. The individual crystallites appear as faceted crystals with certain crystal planes exposed. The oriented polycrystals are oriented by alignment of a facet of the crystallite with a surface or edge of a substrate. Oriented polycrystallites are obtained as described hereinbelow.

Although some of the phase diagrams of the related polycrystalline materials were known and understood to some degree, prior to the invention it was not known if single crystals of any of (Na, M, Bi)TiO$_3$ (NBT) or (K, Bi)TiO$_3$ (KBT) family of compositions could be grown, particularly in the rhombohedral symmetry which has given high actuation strain in PMT-PT and PZN-PT systems. Consequently, the piezoelectric strain properties of the single crystals were not known.

It has been surprisingly discovered that a composition of rhombohedral phase symmetry and having the formula (M, Bi)TiO$_3$—MTiO$_3$, where M is one or more of Na, K, Rb and Cs, M' is one or more of as Ca, Sr, Ba, Pb, Y, La, Pr, Nd, Sm, Eu, Gd, Tb, Dy, Ho, Er, Tm, Yb and Lu, and where Ti may be substituted in whole or in part by Zr or Hf, Sn, Ge, Mg, Zn, Al, Sc, Ga, Nb, Mo, Sb, Ta and W, demonstrates a low hysteresis piezoelectric actuation when the electric field is applied in the <001> direction of the corresponding cubic phase. For example, in the Na$_{1/2}$Bi$_{1/2}$TiO$_3$—BaTiO$_3$ subclass of this family provided in accordance with the invention, low-hysteresis actuation is possible in the rhombohedral ferroelectric phase when an electric actuation field is applied in the [100] direction. The term low hysteresis is used as previously defined and is exemplified by the strain vs. E field plots shown in FIGS. 10 and 21.

It also has been surprisingly discovered that single crystal compositions formula (M, Bi)TiO$_3$—M'TiO$_3$, where M is one or more of Na, K, Rb and Cs, M' is one or more as Ca, Sr, Ba, Pb, Y, La, Pr, Nd, Sm, Eu, Gd, Tb, Dy, Ho, Er, Tm, Yb and Lu, and where Ti may be substituted in whole or in part by Zr or Hf; Sn, Ge, Mg, Zn, Al, Sc, Ga, Nb, Mo, Sb, Ta and W, possess very high piezoelectric strain coefficients. For example, d$_{33}$ coefficients of greater than 200 pC/N, and preferably greater than 300 pC/N, and more preferably greater than 450 pC/N, have been measured in this family of materials in accordance with the invention.

It further has been surprisingly discovered that single crystal compositions formula (M, Bi)TiO$_3$—MTiO$_3$, where M' is one or more of Na, K, Rb and Cs, MD is one or more as Ca, Sr, Ba, Pb, Y, La, Pr, Nd, Sm, Eu, Gd, Tb, Dy, Ho, Er, Tm, Yb and Lu, and where Ti may be substituted in whole or in part by Zr or Hf, Sn, Ge, Mg, Zn, Al, Sc, Ga, Nb, Mo, Sb, Ta and W, exhibit exceedingly high piezoelectric actuation strains. For example, strains of greater than 0.15%, and preferably greater than 0.25%, more preferably greater than 0.50% and most preferably greater than 0.75% have been observed in this family of materials. In one example of a tetragonal phase (Na,Bi)TiO$_3$—BaTiO$_3$ material, an actuation strain of 0.85% was measured.

While these reported properties have been measured in single crystal samples, it is expected that the related textured polycrystalline materials will demonstrate similar improvements in piezoelectric properties.

Figure 2:
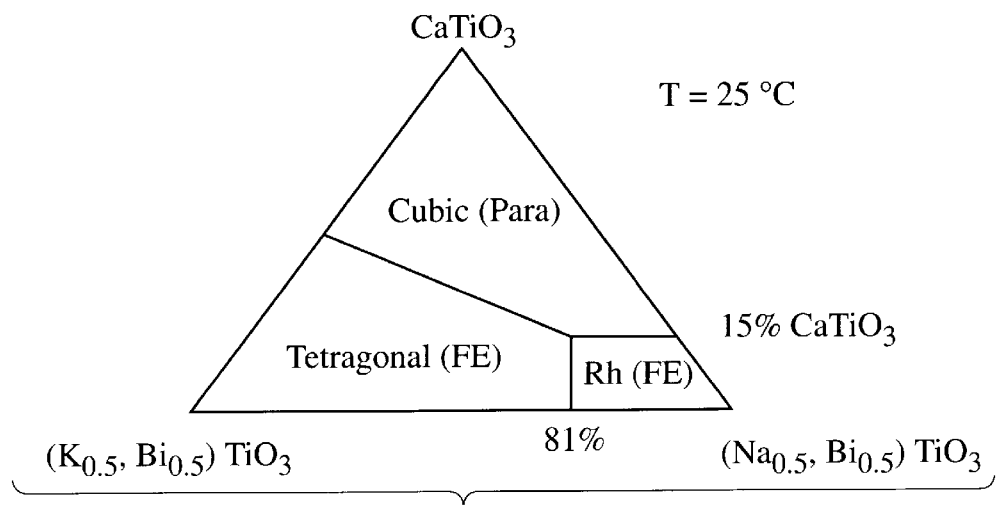
FIG. 2 is a schematic ternary phase diagram for the $CaTiO_3$—$(K_{1/2}Bi_{1/2})TiO_3$—$(Na_{1/2}Bi_{1/2})TiO_3$ system at 25° C.
Figure 3:
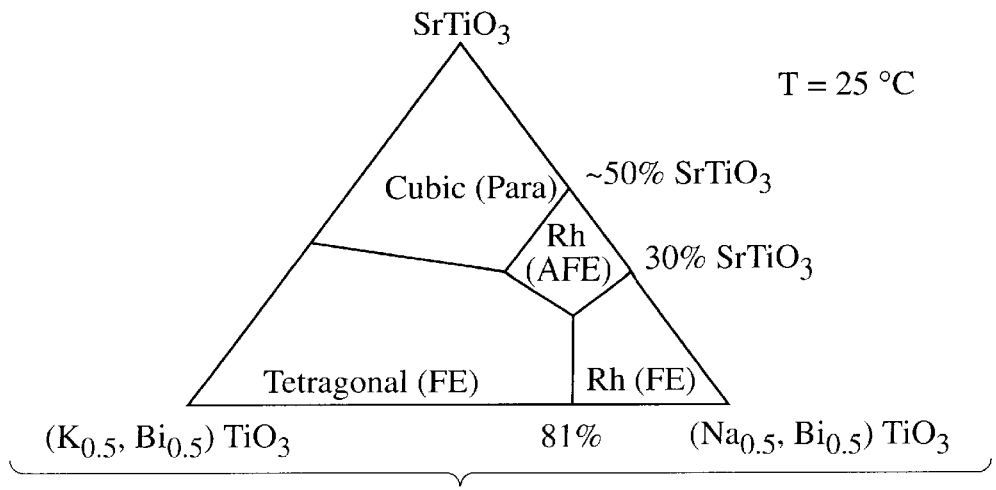
FIG. 3 is a schematic ternary phase diagram for the $SrTiO_3$—$(K_{1/2}Bi_{1/2})TiO_3$—$(Na_{1/2}Bi_{1/2})TiO_3$ system at 25° C.

According to the present invention, schematic phase stability diagrams for solid solutions of (M$_{1/2}$Bi$_{1/2}$)TiO$_3$—M'TiO$_3$ are provided, where M is one or more of Na or K; and M' is Ba, Ca, Sr, Ba or Pb; and M" is Ti which exemplify the material of the invention. Schematic phase stability diagrams for a variety of M'TiO$_3$—(K$_{1/2}$,Bi$_{1/2}$)TiO$_3$—(Na$_{1/2}$, Bi$_{1/2}$)TiO$_3$ systems are shown in FIGS. 1–3. The Figures illustrate that a variety of morphotropic phase boundaries (MP's) can be accessed in these solid solution systems.

Solid solutions of (Na, Bi)TiO$_3$—(K, Bi)TiO$_3$—BaTiO$_3$ (NBT-KBT-BT) and (Na, Bi)TiO$_3$—(K, Bi)TiO$_3$—PbTiO$_3$ (NBT-KBT-PT) are expected to exhibit stable tetragonal and rhombohedral ferroelectric phase fields at room temperature (see FIG. 1). KBT is a counterpart to NBT which is a tetragonal ferroelectric at room temperature. The MPB between these two compounds lies at approximately 81% NBT. The phase diagram also suggests a morphotropic phase boundary (MPB) between rhombohedral (ferroelectric) and tetragonal (ferroelectric) phases at approximately 6 molar % and 13.5 molar % of BaTiO$_3$ and PbTiO$_3$, respectively.

Thus, in one embodiment of the invention, an NBT-bKBT-cBT solid solution is provided in which b is in the range of about 15–22%; and/or c is in the range of 3 to 12% and preferably in the range of about 5–8%. The composition is adjusted within the stated range to obtain either the tetragonal or rhombohedral symmetry phase, as is desired.

In another embodiment of the invention, an NBT-bKBT-cBT solid solution is provided in which b is in the range of about 15–22%; and/or c is in the range of 12 to 20% and preferably in the range of about 12–15%. The composition is adjusted within the stated range to obtain either the tetragonal or rhombohedral symmetry phase, as is desired.

The (Na, Bi)TiO$_3$—(K, Bi)TiO$_3$—CaTiO$_3$ BT-KBT-CT) system shown in FIG. 2 differs from that for NBT-KBT-BaTiO$_3$/PbTiO$_3$ system in that one endmember is cubic (paraelectric). The ternary phase diagram suggests that a three-phase morphotropic point joining the rhombohedral (ferroelectric), tetragonal (ferroelectric) and cubic (paraelectric) fields exists in this system. Compositions that are in the rhombohedral field, but near the morphotropic point, are of particular interest. Thus, in one embodiment of the invention, an NBT-bKBT-cCT solid solution is provided in which b is in the range of about 15–22%; and/or c is in the range of 12 to 20% and preferably in the range of about 13–18%. The composition is adjusted within the stated range to obtain either the tetragonal, cubic or rhombohedral symmetry phase, as is desired.

In the (Na, Bi)TiO$_3$—(K, Bi)TiO$_3$—SrTiO$_3$ (NBT-KBT-ST) system, a rhombohedral (antiferroelectric) phase exists at room temperature, leading to the phase diagram with four phase fields shown in FIG. 3. This system therefore also provides a rhombohedral (antiferroelectric) composition which can undergo a AFE-FE transition. Thus, in one embodiment of the invention, an NBT-bKBT-cST solid solution is provided in which b is in the range of about 15–22%; and/or c is in the range of 22 to 35%.

It is readily apparent that the level of allaline earth titanate and/or KBT in the solid solution may be varied to obtain preferentially the rhombohedral or tetrahedral phase material. Thus, solid solutions which are rich in KBT or NBT solid solutions heavily doped with Ba are amongst those which will exhibit a stable tetragonal ferroelectric phase at room temperature. Similarly, solid solutions which are rich in NBT, at the expense of KBT and/or BT or PT will demonstrate stable rhombohedral ferroelectric phases having a low hysteresis of actuation.

Thus, the proportion of alkaline earth dopant, M", may be selected with reference to the phase diagrams of FIGS. 1–3 to obtain a composition with a desired symmetry phase at or near a morphotropic phase boundary. In addition, one or more elements for M may be used and their relative proportions also may be selected to obtain a composition with a desired symmetry phase at or near a morphotropic phase boundary. Further, those elements known to substitute readily at the A- and B-sites of the perovskite lattice may be incorporated, the B-site being that cation site that is 6-fold coordinated by oxygen. In particular, aliovalent cations demonstrated to introduce vacancies in the A-sites of the lattice structure may be desired in some embodiments.

Further provided in accordance with the invention is a recognition that for certain compositions in the family of compositions provided by the invention, near the morphotropic phase boundary, the actuation characteristics are of the character of a field-forced phase change between an antiferroelectric (AFE) and ferroelectric (FE) phase. This actuation mechanism is found to yield significant stain. The existence of an antiferroelectric phase near room temperature in this system is thus a particular discovery provided by the invention. The family and subclass of compositions as well as the prescribed actuation mechanisms and actuation properties provided by the invention thereby enable a range of actuation abilities and superior actuation performance.

Figure 13:
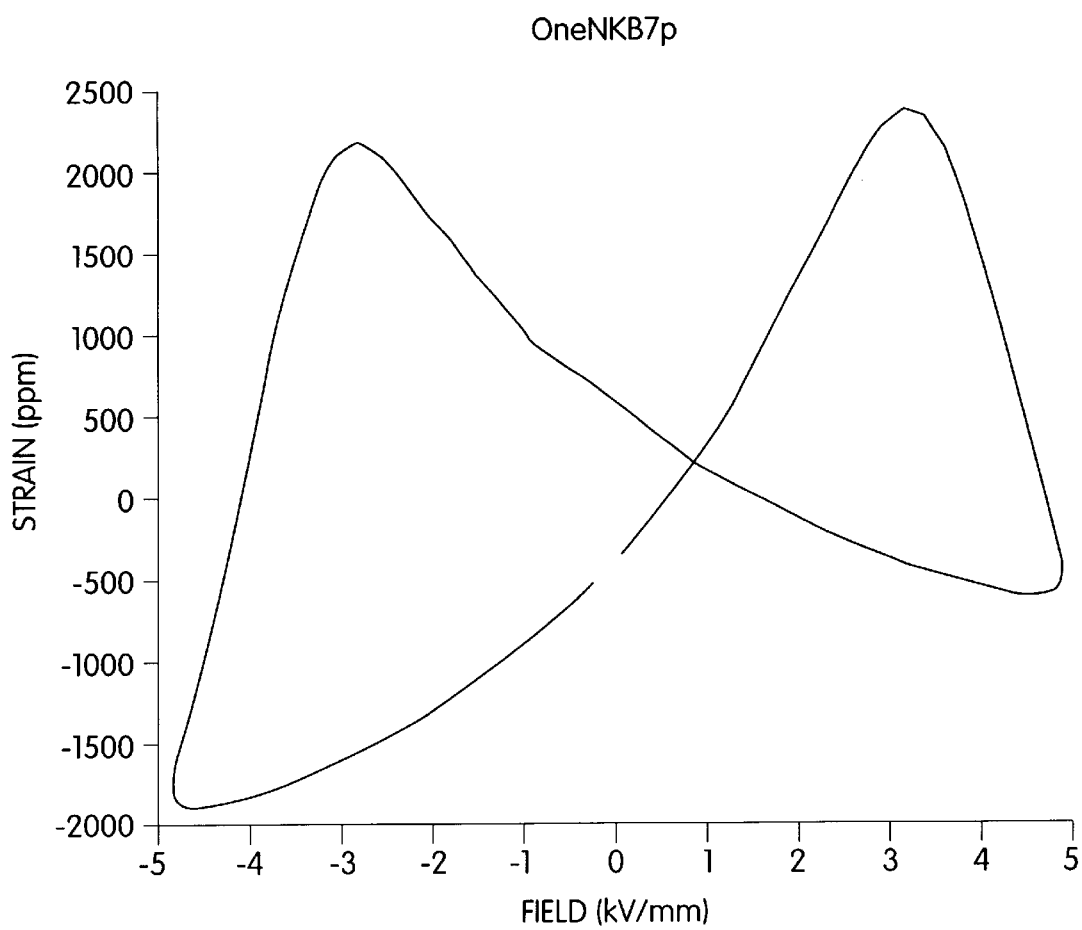
FIG. 13 is a graph of microstrain vs. field loops for Sample 3.

In accordance with the invention, there is provided a further defined subclass of compositions in the family of compositions, this subclass generally designated as single crystals of tetragonal phase. This subclass is found to attain superior actuation properties particularly when an electric field is applied in the <001> direction of the corresponding cubic phase. While the actuation can be hysteretic in nature, characteristic of a domain-switching piezoelectric, the strains attained may be particularly high. Numerous tetragonal phase NBT-BT and NBT-KBT-BT crystals were shown to have free strains of 0.2–0.4% at 30–40 kV/cm. Piezoelectric strain coefficients $d_{33}$ measured at lower field in these crystals were in the range of 150–500 pC/N. FIG. 13 illustrates the results for an NBT-KBT-BT tetragonal phase crystal exhibiting 0.4% strain.

In a particularly preferred embodiment, a tetragonal phase composition with a decreased concentration of the alkali metal ions relative to Bi is preferred. The alkali metal/Bi molar ratio is less than one and more preferably less than about 0.94 and the (alkali metal+alkaline earth metal+Bi)/Ti molar ratio is less than one and more preferably less than about 0.9. The embodiment is exemplified by a composition in the NBT-BT system with 5.82 molar % BT that exhibited an exceptionally high strain of 0.85% at 38 kV/cm as a tetragonal single crystal FIG. 4). Testing at lower field, this crystal exhibited $d_{33}$=360 pC/N, showing that the majority of the actuation strain results from domain switching, consistent with the hysteretic strain loop.

Figure 21:
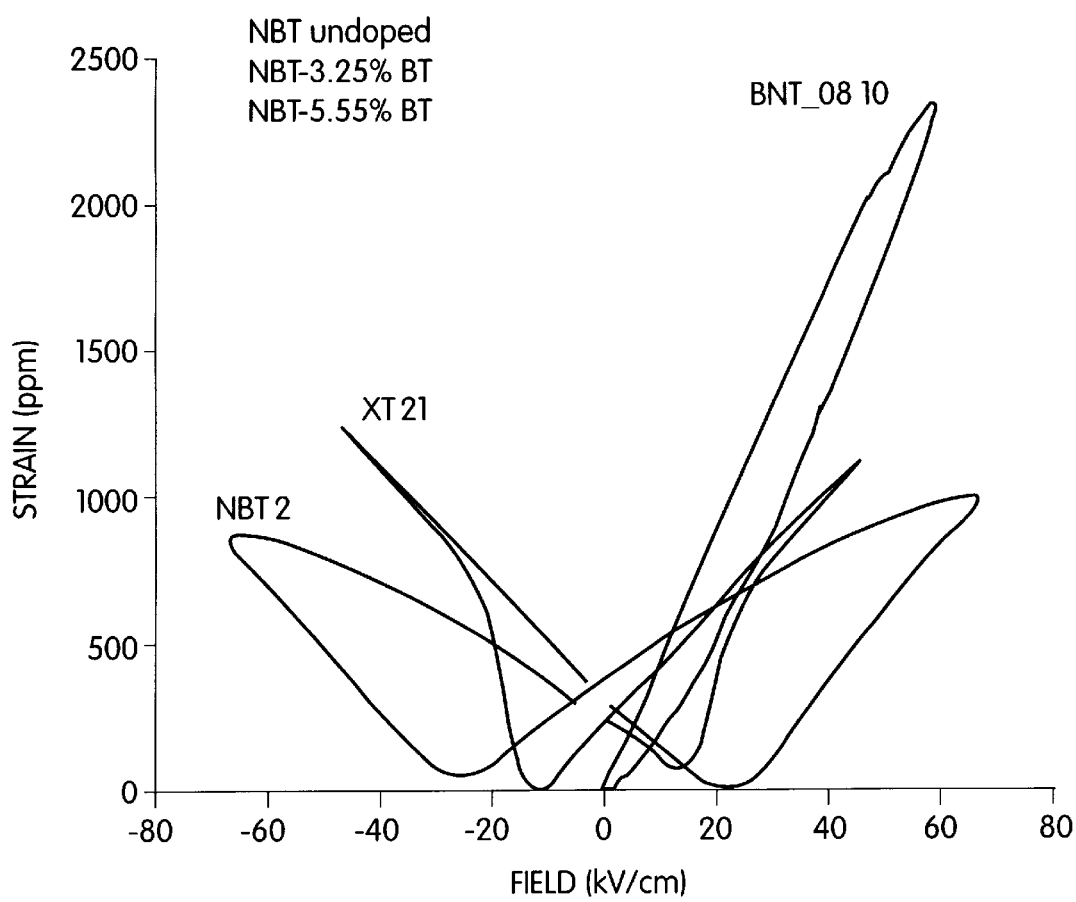
FIG. 21 is a plot of microstrain vs. electric field for rhombohedral single crystals after poling.

A useful figure of merit for electrochemical actuation is the actuation energy density, given by ½ $\epsilon_{max}^2 E/\rho$, where $\epsilon_{max}$ is the maximum strain, $\rho$ is the crystal density and E is Young's Modulus. The present materials have a lower density than the PZTs and PMNs (~6 g/cm$^3$ vs. 7.5–8.5 g/cm$^3$) and higher elastic moduli (polycrystal Young's modulus of 100–110 Gpa vs. 60–70 Gpa in PZTs). The single crystal elastic modulus for NBT has not been measured, but results for the high strain rhombohedral PZN-PT crystals show a factor of 8 reduction in E in the <001> direction. Assuming a similar reduction relative to the polycrystalline modulus for both the tetragonal and rhombohedral phases of NBT-BT, the high strain tetragonal single crystal of FIG. 4 possesses about 11 times the actuation energy of commercial PZT 5H (75 J/kg vs. 6.8 J/kg) and the near-MPB rhombohedral single crystal of FIG. 21 is approximately 1.4 times the actuation energy density of the polycrystalline PMN (6 J/kg vs. 4.2 J/kg), demonstrating the utility of the invention.

Figure 5:
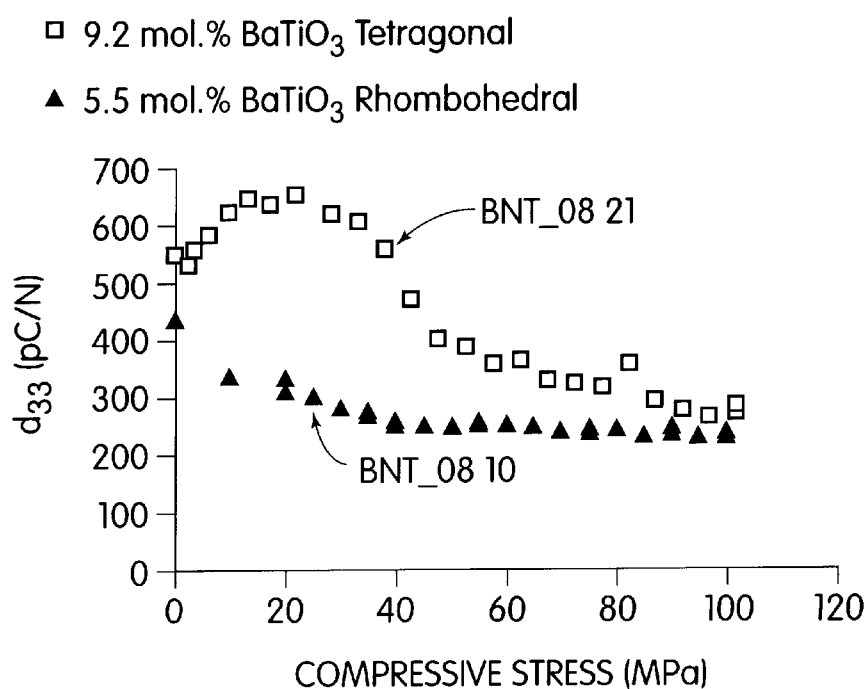
FIG. 5 is a graph of high-field $d_{33}$ for rhombohedral and tetragonal crystals vs. uniaxial compressive strength, measured from the slope of the linear strain vs. field relationship at 20 kV/cm ac field with a 30 kV/cm dc bias.

Testing under load furthermore revealed that the present crystals retain significant actuation capability to quite high stresses. FIG. 5 shows the high-field $d_{33}$ for rhombohedral and tetragonal crystals vs. uniaxial compressive strength, measured from the slope of the linear strain vs. field relationship at 20 kV/cm ac field with a 30 kV/cm dc bias. The $d_{33}$ decrease to 60% of their initial value by about 40 Mpa, but then remain relatively constant to 100 Mpa. The decrease with stress is less than that observed in polycrystalline PZTs. Combined with higher hardness and 2–3 times higher mechanical strength in polycrystalline NBTs compared to lead perovskites, this class of single crystal piezoelectrics demonstrates improved mechanical reliability as well as useful actuation properties.

Single crystal x-ray and electron diffraction data of the NBT-BT show systematic reflections of an ordered superlattice structure with periodicity twice that of the simple perovskite cell. Although not bound by any particular interpretation, the diffraction experiments show that the ordering of the A-site cations is as a primitive or body-centered supercell. This distinctly differs from the face-centered NaCl-type ordering of Na and Bi which has previously been seen in undoped NBT. Thus, an embodiment of the present invention is a perovskite compound of the above-defined composition having a supercell structure with twice the lattice parameters of the single perovskite cell and in which the A-site cations form a primitive or body-centered array.

Still further provided in accordance with the invention, is a further defined subclass generally designated as single crystals fibers of the rhombohedral or tetragonal phase. These are exemplified by $Na_{1/2}Bi_{1/2}TiO_3$—$BaTiO_3$ solid solutions with between 5% and about 10% $BaTiO_3$. Single crystals fibers can be grown directly from the melt by methods such as Czochralski growth or Edge-defined Film-fed Growth (EFG) in these compositions because the crystal composition melts congruently.

Low Hysteresis Tetragonal Phase Single Crystal or Oriented Polycrystalline Actuators.

Prior art investigation into the piezoelectric properties of various single crystal perovskite materials have focused on single crystals with rhombohedral phase symmetry. Interest in the rhombohedral phase persists because it has been demonstrated to exhibit high actuation strain in the PMT-PT and PZN-PT systems. However, only a limited number of perovskites crystallize in this symmetry near room temperature. Many more perovskites of tetragonal phase symmetry are known.

According to the present invention, a single crystal tetragonal ferroelectric perovskite is used as a high strain actuator having low hysteresis. The present invention has recognized that both the phase symmetry and the direction of piezoelectric actuation are relevant to the shape of the hysteresis curves. Prior art single crystal piezoelectrics, such as PMN-PT, had demonstrated low hysteresis only in the rhombohedral phase and it was not expected that the tetragonal phase could also show low hysteresis.

It was only in the present invention that it was recognized that a tetragonal ferroelectric actuated out of its spontaneous polarization direction (<001> with respect to the tetragonal axes) may have low hysteresis actuation. In particular, the <110> and <111> directions are understood to be low hysteresis directions. For example, in the composition systems discussed above, solid solutions which are rich in KBT or NBT solid solutions heavily doped with Ba are amongst those which will exhibit a stable tetragonal ferroelectric phase at room temperature.

High strain actuation of tetragonal crystals when actuated out of its spontaneous polarization direction is not limited to the compositions described hereinabove. Other tetragonal perovskites, such as $BaTiO_3$, $PbTiO_3$ and solid solutions based on these perovskites, can also show useful piezoelectric properties as an oriented single crystal or textured polycrystal when actuated according to the method of the invention.

Of course, with reference to the discussion above with respect to high strain compositions, it is possible to obtain a composition with both high strain and low hysteresis using the compositions of the invention.

Method of preparing single crystal compositions.

In order to observe the improved piezoelectric properties described herein above, it is desirable to provide the composition in other than a polycrystalline form. The piezoelectric compositions described hereinabove have been identified as single crystals, single crystallites or oriented polycrystals.

An aspect of this invention is based upon the discovery that crystals in the NBT-BT system tend to grow as small cubes, much like table salt (NaCl). These cubes have {100} faces. The cube shape appears to be the Wulff shape of the crystal, i.e., the shape which is preferred in order to minimize the surface energy of the crystal. According to the invention, a crystallographically oriented (textured) array which takes advantage of the inherent crystalline anisotropy in properties such as dielectric constant and piezoelectric strain is made by utilizing the growth morphology of single crystals. The methods take advantage of the fact that certain perovskite piezoelectrics can be grown as faceted crystals which expose certain crystal planes (the Wulff shape of the crystal). One example is the aforementioned NBT and KBT solid solutions, which can be grown as cube-shaped crystals much like rock salt. Thus, each flat surface is an {001} orientation of the high temperature cubic phase. Another example occurs with an octahedral shaped crystal in a cubic system, in which each face is a {111} plane. Alignment of the preferentially exposed planes of a number of crystallites against a surface of edge results in the achievement of a common crystallographic orientation in all the crystallites.

The invention consists of the steps of (1) growing ferroelectric crystals or crystallites under conditions which allow them to express a faceted morphology; and (2) alignment of a set of facets and/or edges which is common to all of the crystals or crystallites against a surface or edge, thereby resulting in a crystallographically textured array of crystals.

The invention also provides electromechanical actuators which take advantage of the anisotropic piezoelectric strain, strain coefficient $d_{33}$, and electromechanical coupling factor $k_{33}$ of the single crystal. It can also be used to obtain high dielectric permittivity in systems where the dielectric properties are highly anisotropic or to take advantage of other highly directional crystal properties such as magnetic or optical properties.

For the specific application of electromechanical actuators, it is advantageous to have the high specific actuation properties of a single crystal piezoelectric actuator in a robust and easily manufactured actuator design. According to the present invention, this is done by using smaller, more easily grown crystallites and orienting these crystallites so that they share a common crystal direction (uniaxial texture) or more than one crystal direction (e.g., biaxial texture). For the purposes of this application, "texture" is defined as that condition where in an X-ray pole figure or rocking curve, the full-width-at-half-maximum for the reflection corresponding to the pole or crystal axis in question has an angular breadth of less than 20°. The texturing of the crystallite assembly allows the single crystal actuation properties to be used without the need to grow, orient and cut large single crystals. This texturing approach may be used with any piezoelectric actuator composition which can be grown or otherwise prepared as faceted crystallites. The reduction in the size of the crystals necessary to fabricate an actuator not only makes processing easier, it also improves the mechanical robustness of the actuator. It is well-known from the theory of brittle fracture (Griffith theory) that the probability of finding a flaw of a certain size within a body increases with its volume. Furthermore, by using an array of crystallites, the fracture of one crystallite does not cause failure of the entire actuator, unlike what can happen with single crystals. Therefore, reducing the size of the crystallites according to the present invention mitigates against catastrophic failure of the actuator.

An actuator composed of many crystallites can have nearly the same piezoelectric constants as a single crystal actuator. Such an array of oriented crystallites can also be combined with a polymer matrix or ceramic or metal reinforcements to improve the overall actuation or dielectric constant or mechanical properties.

One embodiment of the present invention uses perovskite crystals which a cubic shape such that each face is a {100} plane of the corresponding cubic phase. Using a perovskite of rhombohedral crystal symmetry at the actuation temperature, the assembly of crystals is actuated in the <100> direction of the corresponding cubic phase by aligning the crystals so that at least one {100} face of each crystal is co-planar with the others.

In another embodiment, a crystal which is cubic at the growth temperature and tetragonal at the use temperature grows with a cube morphology and is aligned in the same way. In this instance, the assemblage of crystals behaves as a domain switching ferroelectric, since a strong electric field applied normal to the common { 100} plane (alignment plane) poles each crystal by domain reorientation. When the field direction is switched, the ferroelectric polarization of the crystal is switched through domain wall motion. This actuator has increased actuation performance relative to a polycrystalline compact of the same composition and phase in which the grains have a random crystallographic orientation with respect to one another.

In yet another embodiment, the crystal symmetry at the actuation temperature is tetragonal and the crystal is grown with an octahedral crystal morphology, exposing the {111} planes of the corresponding cubic phase. Alignment of the common {111} faces of the crystals allows actuation out of the spontaneous polarization direction {100}.

We note that in previously reported PMN-PT and PZN-PT single crystal actuators, the crystal shapes do not lend themselves to the methods of this invention. Described are PZN-PT and PMN-PT crystals grown in a complex, non-symmetric "arrowhead" shape with a variety of crystal faces appearing on any given crystallite, thereby teaching away from the present invention. Nonetheless, by controlling the crystal growth, shape and rate, we have succeeded in achieving textured polycrystals in these systems as well, as is demonstrated in Example 9.

According to the invention, either cubic or octahedral Wulff shapes are grown from a perovskite compound at high temperature by controlling the composition, flux composition, temperature and cooling rate. The crystal morphology can be determined by the equilibrium interfacial energies, with a cubic morphology growing when the {100} faces have the lowest energy. The crystal shape can also be determined by the rate of growth of particular crystal planes (growth rate anisotropy) in addition to surface energy anisotropy.

Additional embodiments of the present invention represent different methods by which large numbers of faceted crystals can be grown, harvested and oriented into a textured array.

In one embodiment, the crystallites are nucleated randomly in a flux which may be constituents of the crystal composition (self flux) or which includes another component which is not substantially incorporated into the crystal during growth (solvent flux). By adjusting the composition, amount of flux and growth conditions (temperature, cooling rate), crystallites are grown such that they do not substantially impinge upon one another. Unimpeded growth is important to the formation of free single crystals of similar morphology. The flux in which the crystals are embedded is subsequently to be removed by chemical etching, leaving behind the crystallites. Alternatively, the crystallites are removed from the flux while it is liquid, using for example a mesh. The crystals are then classified according to size and assembled into an actuator structure by orientation processes described later.

In another method of the invention, previously grown crystals are crushed and sized to achieve a common starting crystallite size. These serve as seeds for further crystal growth. The seed crystals are immersed in a flux as described above in which they coarsen until they are of a desirable size. They are then removed from the flux by chemical etching or sieving the fluid flux.

Alternatively, the crystals may be obtained by vapor phase growth of the crystals on a surface. It has further been observed that the perovskite NBT crystals tend to cleave along their {100} planes. This tendency may be used to produce orientable crystallites by fracturing larger crystals to expose the {100} faces of the high temperature, cubic polymorph material. Comminution of crystals, whether they are initially faceted or not, results in small crystals with predominantly {100} fracture surfaces. These surfaces are then aligned by one of the processes described herein to obtain a textured array.

Figure 6A:
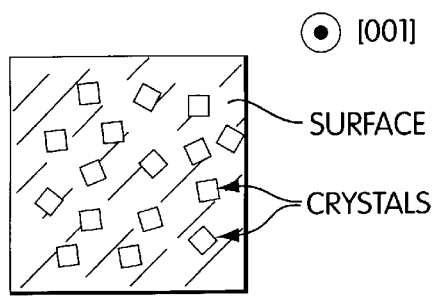
FIG. 6 is a top view (A) and a side view (B) of an array of textured crystallites oriented according to the method of the invention.
Figure 6B:
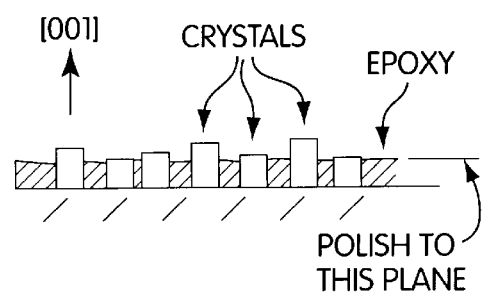

A method of orienting the crystallites into a textured array is described with reference to FIG. 6. The crystallites are sized so that the majority of the crystals are at least as large in diameter as the desired final thickness of the actuator. The crystallites are then settled onto a flat surface, for instance by shaking a collection of dry crystals, or by using the capillary action of a liquid that wets the surface of the crystals and the orientation surface and draws the two together. This liquid is then removed by evaporation. The flat surface can be a working surface for processing alone, or can serve as an electrode of the final composite actuator. The oriented crystallite array is then further processed to obtain an actuator. In one embodiment, it is sintered at high temperature to bond the crystals together, with or without a sintering liquid phase. In another embodiment, it is infiltrated with a polymer such as epoxy. After the crystallites are bonded to one another, the electroding surface is ground down to expose the majority of the crystallites, as indicated by the arrow in FIG. 6. A top electrode is applied to the ground surface. This process results in a uniaxial alignment of the crystallites with a common orientation normal to the orientation surface.

Figure 7A:
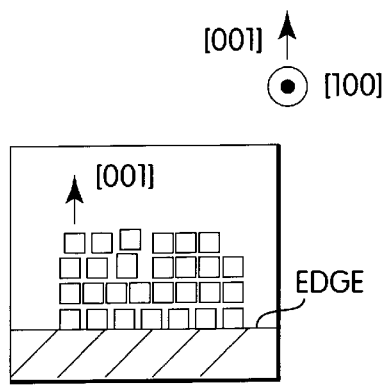
FIG. 7 is a top view (A) and a side view (B) of an array of biaxially textured crystallites oriented according to the method of the invention.
Figure 7B:
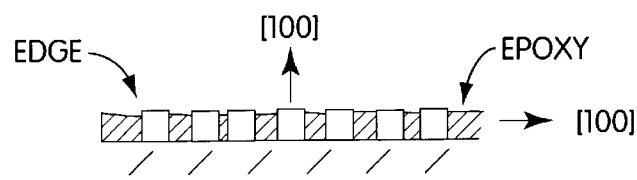

Biaxial alignment is desirable in many instances. Biaxial alignment is defined by having the crystallites oriented with such close alignment not only normal to the plane of the surface, but also within the surface. With reference to FIG. 7, such alignment can be obtained by settling the crystallites against a reference edge as well as a surface, e.g., shaking on an incline, or by using capillary forces from a liquid that wets the crystallites to draw them together. Supplying a capillary force between adjacent crystallites, for instance with a wetting liquid, assists in achieving biaxial texture by drawing the faceted faces of adjacent crystallites into contact. The assembly of biaxially aligned crystals is then further processed to obtain an actuator as described above.

The crystallites may be aligned while in the growth flux medium, e.g., an in situ alignment. During growth of the crystallites as described hereinabove, the crystallites may be allowed to either float up (low density) or sink down (high density) by choosing a flux that is either denser than or less dense than the crystals. A flat surface, which can be the flat surface of the flux liquid itself or the surface between the growth container and the flux, or a separate solid material, is placed either at the top or bottom of the melt to serve as the orientation surface. The crystals travel by gravitational force or buoyancy or convection through the flux and settle in an oriented array against the orientation surface after which they can be removed. The orientation surface, if it is a metal suitable for use as an electrode, can be left in place as the electrode of the final actuator assembly.

In yet another alternative embodiment, a high electric field may be used to orient the crystals. The method of the invention is adaptable to the prior art systems for PZN-PT and PMN-PT. As is demonstrated in the examples which follow, the crystal growth method described herein may be used to obtain textured crystallites.

EXAMPLE 1

Single Crystal Growth in the System $Na_{(1/2)}Bi_{(1/2)}TiO_3$—$BaTiO_3$

A powder mixture of the target composition $(0.94)Na_{(1/2)}Bi_{(1/2)}TiO_3$—$(0.06)BaTiO_3$ was prepared, with wt % each of $Na_2CO_3$ and $Bi_2O_3$ being added in excess in order to form a liquid flux. The powder mixture was prepared from the following starting materials in the following amounts:

| Compound | Manufacturer | Amount (g) | Comment |
|---|---|---|---|
| $Bi_2O_3$ | Morton Thiokol | 102.3408 | 20 wt % excess of the component |
| $Na_2CO_3$ | MCB Reagents | 23.2764 | 20 wt % excess of the component |
| $TiO_2$ | NanoTek | 58.4750 | |
| $BaTiO_3$ | Morton Thiokol | 10.8980 | |

The powders were ball-milled in a 1000 mL polypropylene bottle containing 50% by volume of zirconia milling media and ~350 mL ethanol for ~12 hours at a rolling speed of 120 rpm. The mixed powder was dried with a heating lamp, then ground in a mortar and pestle, then placed in an alumina crucible (100 mL) with a cover and calcined in air according to the following heating schedule: 8 hour ramp from room temperature to 800° C., hold for 2 hours, furnace-cool to 20° C. with power off. A Thermolyne 47900 furnace was used. The powder was removed from the crucible and ground in a mortar and pestle, then placed in a 100 mL platinum crucible, covered with a platinum lid and then placed within a 250 mL alumina crucible and covered with an alumina lid. The sample was placed in a Lindberg/Blue M 1700° C. furnace and fired according to the following crystal growth schedule: 13.5 hour ramp from room temperature to 1350° C., hold for 5 hours, 120 hour cool to 750° C., furnace cool to 25° C.

Within the Pt crucible, more than 50 single crystals varying in size from 1 mm to >10 mm were observed, embedded in crystallized orange-yellow flux. The flux was dissolved by filling the crucible with concentrated hydrochloric acid and allowing the mixture to sit overnight. The acid was then rinsed from the crystals with water. It was subsequently found that nitric acid works to dissolve the flux as well. The crystals were removed from the crystals, separated, and placed again in concentrated hydrochloric acid to remove the residual flux.

On the platinum lid of the crucible, several crystals growing with a cubic shape were observed, showing that faceted crystals of this compound can be grown by vapor phase transport to a seeding surface, as described above.

The crystals embedded within the crystallized flux were observed to grow with a cubic habit. Larger crystals of 6–10 mm diameter and exhibiting a clear {100} or cube face were sliced parallel to that face using a diamond wafering saw. Both sides of the resulting single crystal plates were polished with successively finer diamond paste to a thickness of ~1 mm thickness and a final grit site of 1 $\mu$m.

For testing, colloidal silver paint electrodes were applied with a brush to both of the faces of cut and polished crystals. Dielectric constant measurements were performed on an HP 4194A impedance analyzer at 1 kHz and 10 kHz frequencies. Piezoelectric strain and piezoelectric strain coefficient ($d_{33}$) were measured using a laser interferometer apparatus while applying high voltage to the sample (up to 20 kV) at a low frequency (1 Hz).

Results for Rhombohedral $BaTiO_3$ doped NBT. Sample 1 was a crystal polished to a thickness of 1.098 mm. The composition was analyzed by electron microprobe microanalysis (EPMA), giving the following results:

| | Na | Bi | Ti | Ba | O |
|---|---|---|---|---|---|
| Nominal Composition | 0.470 | 0.470 | 1.000 | 0.060 | 3.000 |
| Sample 1 | 0.459 | 0.486 | 1.042 | 0.032 | 2.981 |

Thus the sample contains a lower Ba concentration than the overall batch composition. This places the composition clearly within the rhombohedral stability field. X-ray diffraction of the (100) face of the crystal showed that it was single crystalline, and also showed no splitting of the (100) and (200) peaks of the corresponding cubic phase. This shows that the sample is not so highly doped with Ba as to be of tetragonal symmetry.

Figure 8:
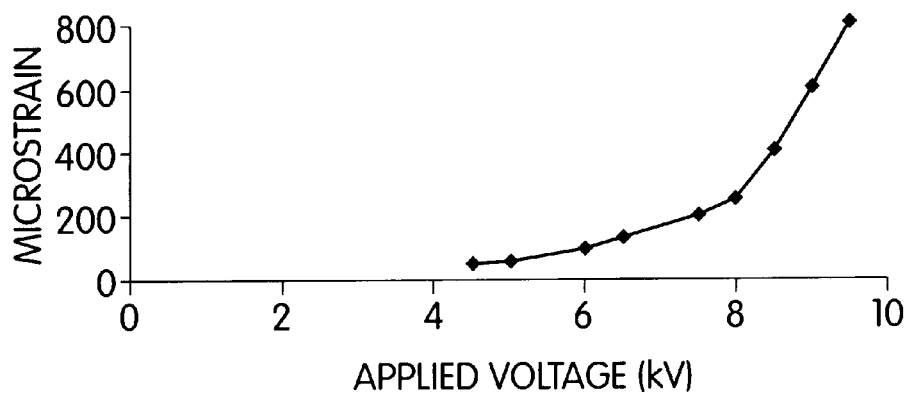
FIG. 8 is a graph of microstrain vs. applied voltage for sample 1 before poling.

The capacitance, measured at 1 kHz, was 197.8 pF. The sample was placed in the strain testing apparatus (clamped in the longitudinal direction and immersed in silicone oil bath to prevent arcing). The sample was first tested before poling. FIG. 8 shows the strain vs. the applied voltage measured at room temperature.

Figure 9:
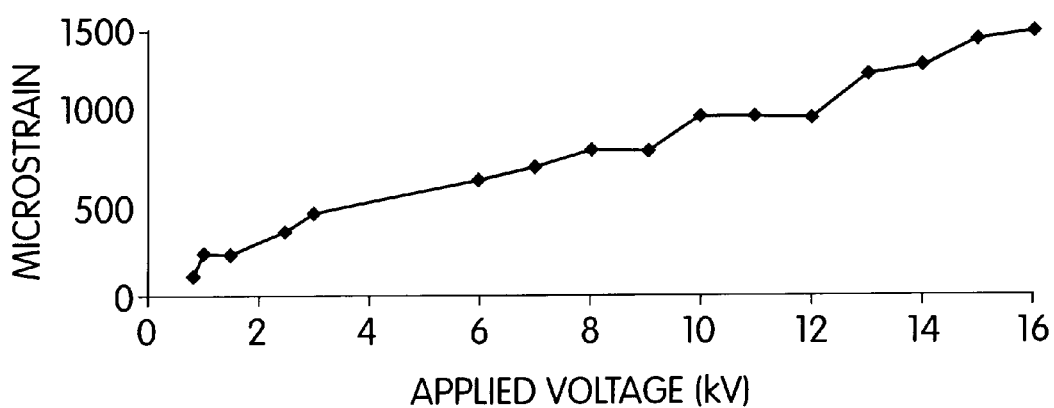
FIG. 9 is a graph of microstrain vs. applied voltage for sample 1 after poling.

The sample was then poled while in the testing apparatus for 10 minutes under a 3.6 kV direct current voltage. FIG. 9 shows the strain vs. applied voltage measured at room temperature after poling. A higher strain at equal voltage was achieved, with a maximum strain of 1500 microstrain (0.15%) being achieved at 16 kV. The strain had not yet saturated at this voltage.

Figure 10:
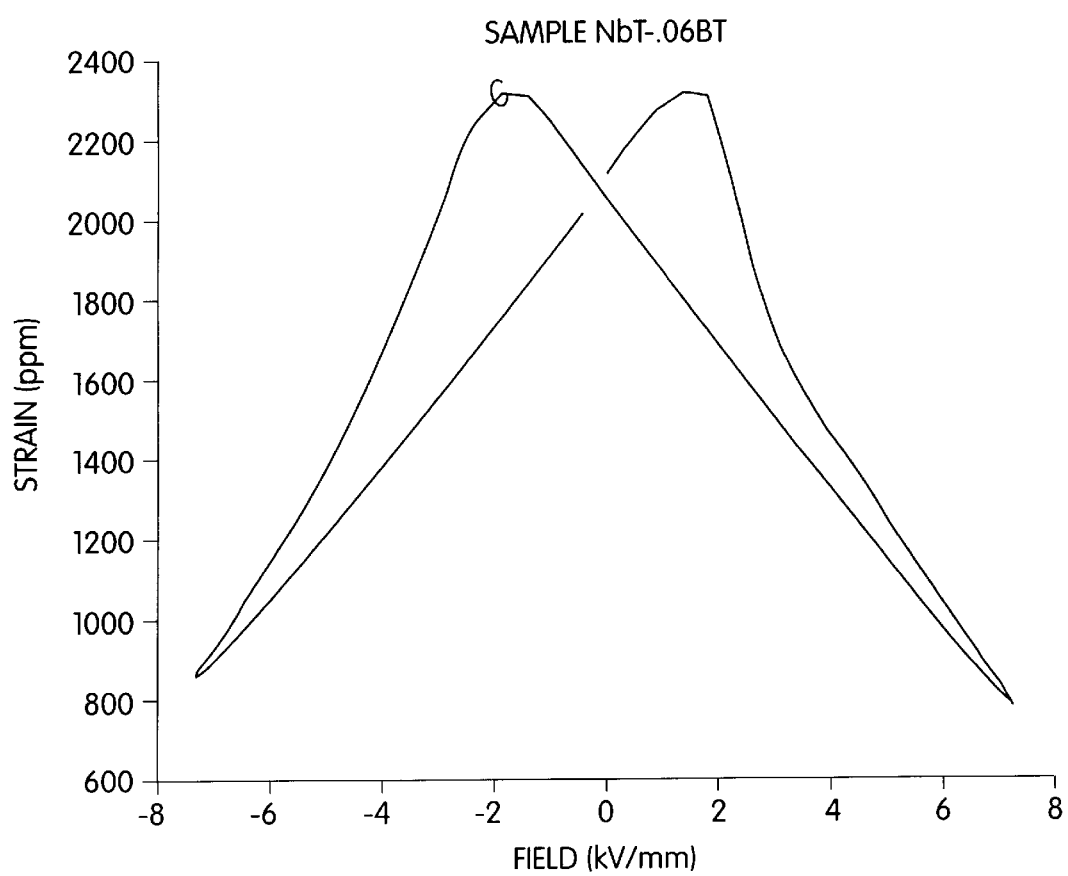
FIG. 10 is a graph of microstrain vs. electric field for sample 1 after poling.

From the nearly linear slope in FIG. 9, the piezoelectric strain coefficient $d_{33}$, is obtained. Since the applied voltage is the peak-to-peak value, the positive voltage is half of the applied voltage. For example, 500 microstrain is achieved for a change of 2.5 kV. The $d_{33}$ value is therefore approximately 200 pC/N. FIG. 10 shows the complete strain vs. applied field loop for this sample. It is seen that the sample has small hysteresis compared to conventional ferroelectric actuators. Thus this rhombohedral phase single crystal is shown to function as a piezoelectric actuator with low hysteresis.

EPMA analysis of two other crystals from the same growth run showed Ba concentrations of 0.27 and 0.31 respectively, which also place them within the rhombohedral phase field.

Results on Tetragonal Phase $BaTiO_3$-doped NBT Sample 2 was another single crystal from the same growth run, which EPMA showed to have a higher Ba concentration than the overall batch composition. A line scan, in which the probe was stepped across the sample surface, was also conducted using EPMA to examine for nonuniformity in Ba doping level. The average concentrations of the line scanned points is given below; the crystal was found to be uniform. The compositional analysis of the crystal is given below:

|  | Na | Bi | Ti | Ba | O |
|---|---|---|---|---|---|
| Nominal Composition | 0.470 | 0.470 | 1.000 | 0.060 | 3.000 |
| Sample 2 | 0.459 | 0.451 | 1.079 | 0.096 | 2.915 |
| Sample 2 line scan | 0.462 | 0.446 | 1.057 | 0.095 | 2.939 |

Figure 11:
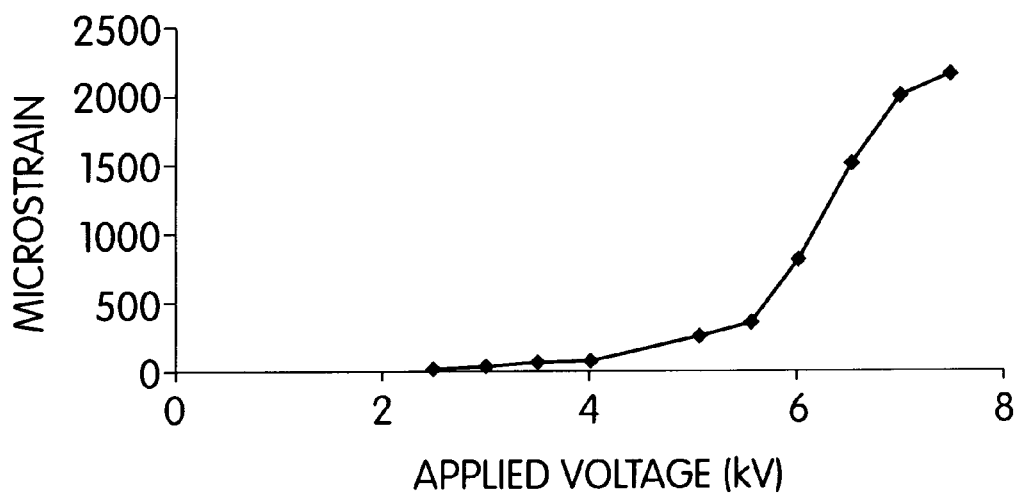
FIG. 11 is a graph of microstrain vs. electric field for sample 2 before poling.

This sample has a high enough $BaTiO_3$ content to be well within the tetragonal phase field. The crystal was polished to a thickness of 1.165 mm. Before poling, this crystal was tested at room temperature to a maximum field of 6.44 kV/mm (7.5 kV voltage), and exhibited a stain of 2150 microstrain (0.215%), as shown in FIG. 11. After poling in the actuation direction with a field of 3.3 kV for 10 min. at room temperature, the crystal was tested again at room temperature. It exhibited 0.20% strain at 7.73 kV/mm, as shown in FIG. 12.

Figure 12:
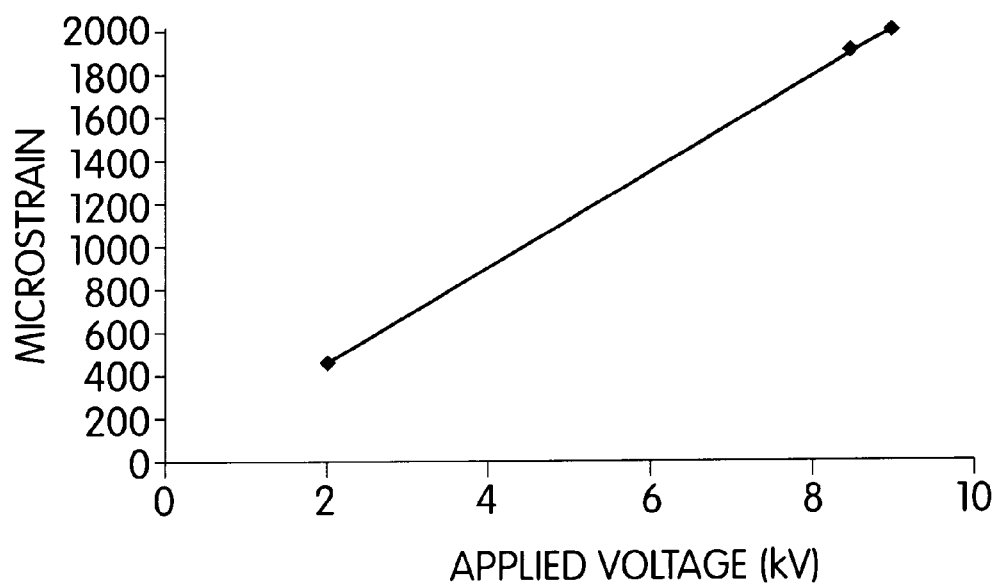
FIG. 12 is a graph of microstrain vs. electric field for sample 2 after poling.

From the data in FIG. 12, it is found that $d_{33}=428$ pC/N for Sample 2 after poling. The slight reduction in strain after poling is consistent with a tetragonal ferroelectric in which poling induces some preferential ferroelectric domain orientation in the direction of the applied field.

EXAMPLE 2

Single Crystal Growth in the System $Na_{(1/2)}Bi_{(1/2)}TiO_3$—$K_{(1/2)}TiO_3$—$BaTiO_3$.

The nominal crystal composition of this batch was $(0.782)Na_{(1/2)}Bi_{(1/2)}TiO_3$—$(0.138)K_{(1/2)}Bi_{(1/2)}TiO_3$—$(0.08)BaTiO_3$. A greater amount of excess $Bi_2O_3$ and $Na_2CO_3$ was added in this growth run than in Example 1. The amounts of each component are given in the table below:

| Compound | Manufacturer | Amount (g) | Comments |
|---|---|---|---|
| $Bi_2O_3$ | Alfa Aesar | 73.7132 | includes 20 wt % of total |
| $Na_2CO_3$ | Alfa Aesar | 31.2103 | includes 20 wt % of total |
| $TiO_2$ | Nanotek | 39.2722 | |
| $K_2CO_3$ | Alfa Aesar | 2.3442 | |
| $BaCO_3$ | Alfa Aesar | 0.6209 | |

The processing conditions were similar to those used for Example 1. A Thermolyne Hi-temp, model 46100 furnace was used. The crystal growth schedule was as follows: 13.5 hour ramp from room temperature to 1350° C., hold for 5 hours, cool slowly at a rate of 5° C./min to 800° C., then furnace-cool to room temperature. The growth run yielded smaller crystals of cubic habit and approximately 1 mm dimension in a larger amount of crystallized flux. After removing the crystals from the flux using hydrochloric acid, EPMA analysis was conducted. The K concentration was lower than that of the overall batch composition by approximately a factor of 10. The Ba concentration was slightly higher than the overall composition. This places the composition well within the tetragonal phase field, as shown in FIG. 1. X-ray diffraction of the crystals showed splitting of the (100) and (200) reflections of the corresponding cubic phase, consistent with the existence of the tetragonal phase. Optical microscopy showed the existence of multiple ferroelectric domains, predominantly oriented at 90° with respect to one another.

Figure 14:
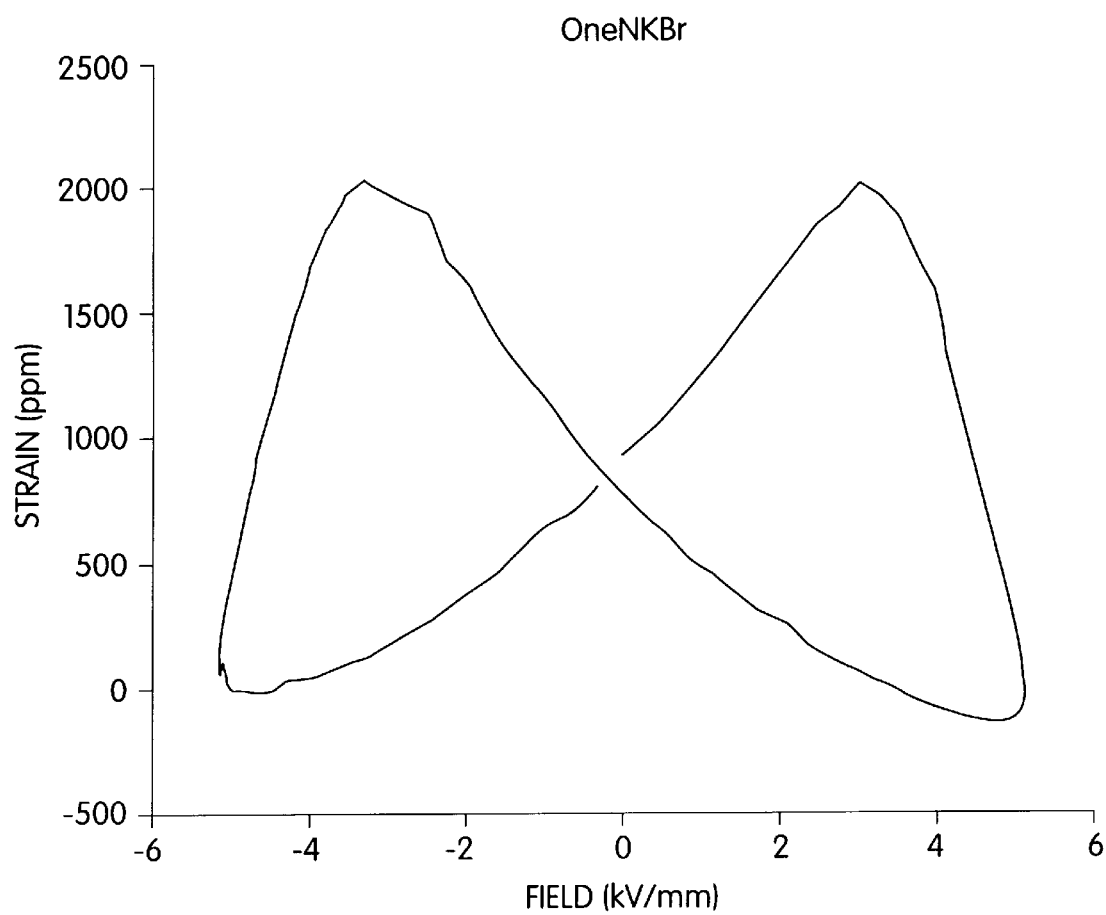
FIG. 14 is a graph of microstrain vs. field loops for Sample 5.

Several of the crystals were strain tested at room temperature after poling. FIGS. 13 and 14 show the strain vs. field loops for Samples 3 and 5 respectively, in which the maximum strain levels reached are 0.4% and 0.2% strain respectively. Each sample shows a larger hysteresis than FIG. 10, which is to be expected from a tetragonal ferroelectric undergoing domain switching.

The results from this growth run show that single crystals of cubic morphology can be grown by a flux method in the system $Na_{(1/2)}Bi_{(1/2)}TiO_3$—$K_{(1/2)}Bi_{(1/2)}TiO_3$—$BaTiO_3$. These crystals can be of a composition which falls in the tetragonal phase field. Together with the tetragonal phase NBT-BT crystals from Example 1, it is shown that tetragonal ferroelectric phase single crystals of the compositions defined by the invention exhibit high piezoelectric strain when oriented in <100>.

EXAMPLE 3

Textured Crystallites by Cleavage and Capillary Aggregation

Figure 15A:
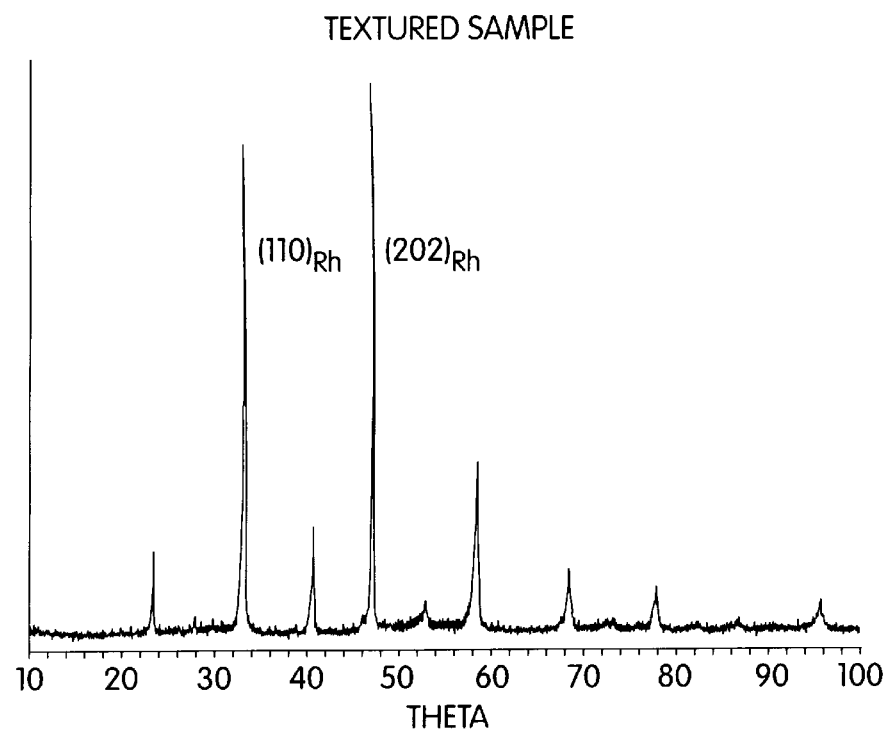
FIG. 15 is an x-ray diffraction (XRD) pattern for (a) a textured single crystallite sample and (b) a randomly oriented polycrystalline sample.
Figure 15B:
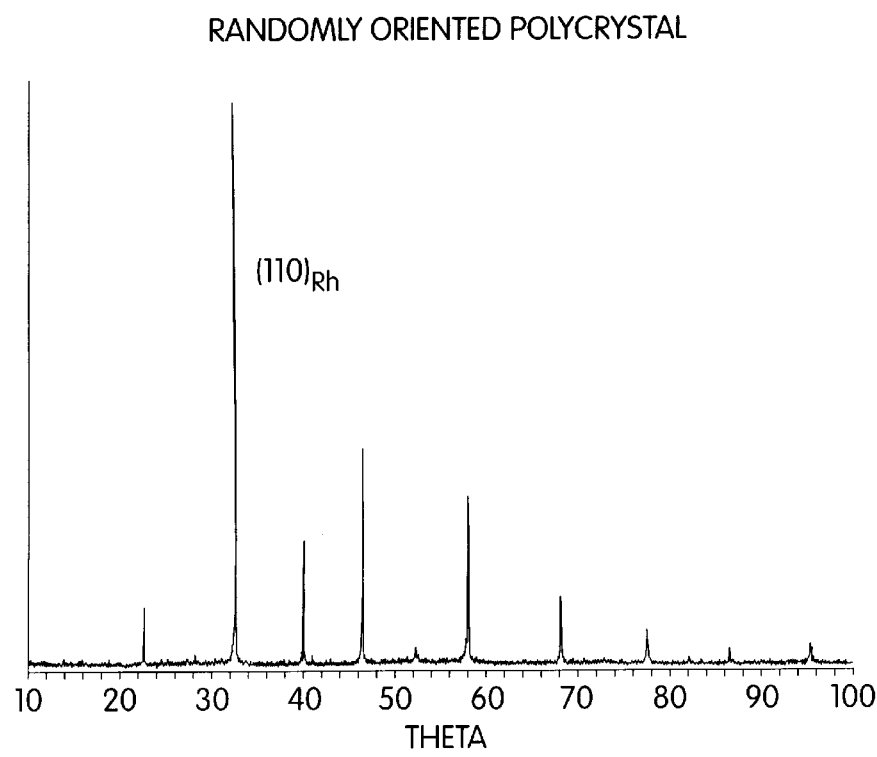

Several of the Ba-doped NBT crystals of Example 1 were ground coarsely using a mortar and pestle. The resulting powder was mixed with the liquid binder collodion, and spread on a glass slide. The slide was heated for about 10 minutes in a small box furnace to set the glue. During drying, the powder tends to settle against the glass surface, and the capillary action of the liquid also helps to draw the particles together and against the glass surface. After drying, the powder was subjected to powder x-ray diffraction. The x-ray diffraction pattern, FIG. 15, shows stronger intensity for the (202) reflection of the rhombohedral phase ((200) of the corresponding cubic phase) than does a randomly oriented powder. In the powder diffraction pattern for NBT, JCPDS file 36-0340, the (110) of the rhombohedral phase is expected to have the highest intensity. In our sample, the (202) has the highest intensity, showing that preferential alignment of the cube faces parallel to the glass surface has been achieved. This result shows that comminution of large crystals followed by an alignment against a surface yields a preferential texture in the array of crystallites.

EXAMPLE 4

Composite Actuators from Multiple Single Crystallites

A growth run producing many small crystals in the composition system $(0.90)Na_{(1/2)}Bi_{(1/2)}TiO_3$—$(0.10)BaTiO_3$ was conducted according to the procedure in Example 2. The starting materials and amounts are given in the following table:

| Compound | Manufacturer | Amount (g) | Comments |
|---|---|---|---|
| $Bi_2O_3$ | Alfa Aesar | 70.3282 | includes 20 wt % of total |
| $Na_2CO_3$ | Alfa Aesar | 32.4805 | includes 20 wt % of total |
| $TiO_2$ | NanoTek | 37.3268 | |
| $BaCO_3$ | Alfa Aesar | 9.2216 | |

Figure 16:
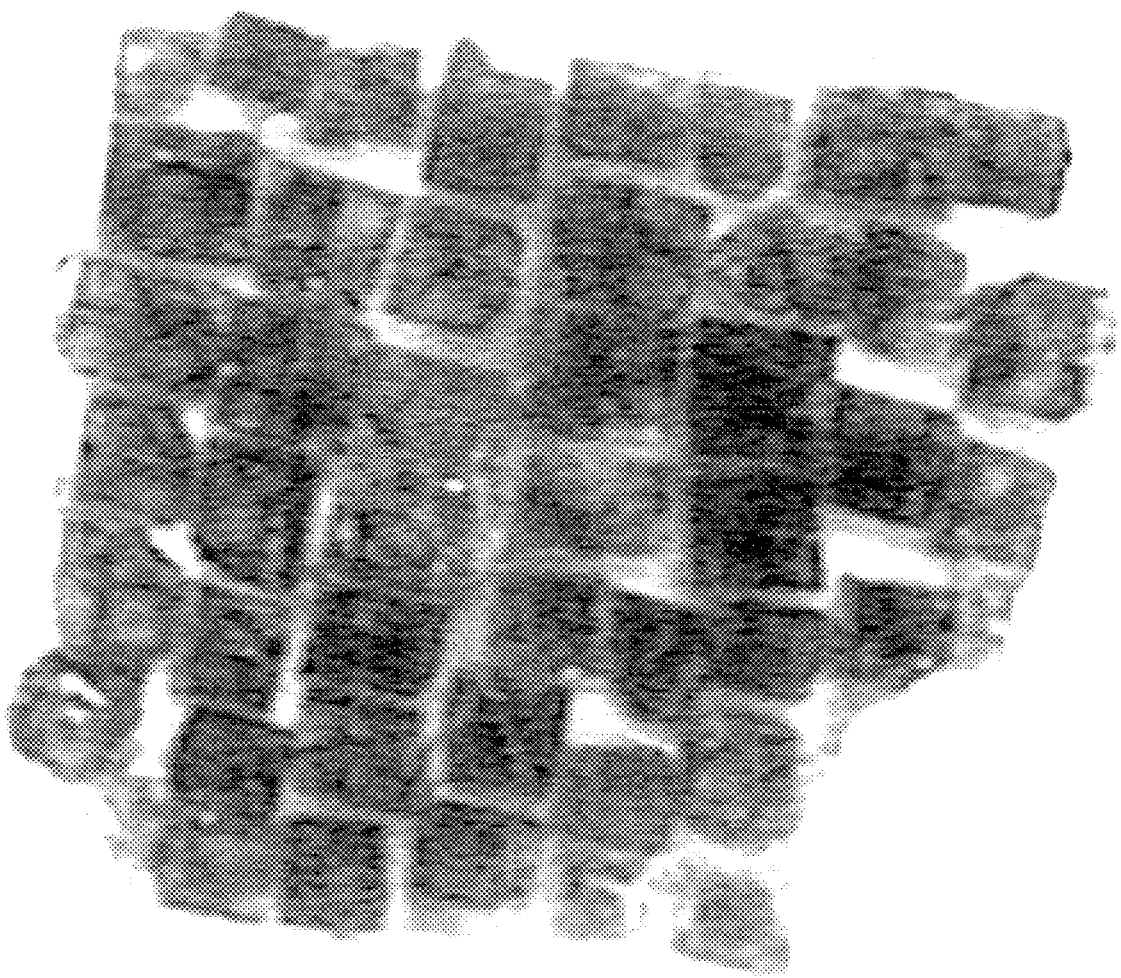
FIG. 16 is a photograph of a composite actuator assembled from cubic single crystals.

Small crystals (<1 mm³) of cubic habit and of near-MPB composition, removed from the as-grown batch by hydrochloric acid dissolution were used to fabricate a multi-crystal actuator. A 1 cm² area was cut out of 1.5 mm thick piece of Teflon for the mold. High-temperature double-sided tape was used for contacting the mold to a piece of metal (support) as well as to hold the crystals in place. The cube faces of the crystals were aligned flat against the supporting surface of the mold, packed together in as high a density as possible. Shell Epon 9405 (a two-part epoxy) was chosen for the matrix. 2.0 g of each part were mixed together. The epoxy was poured on top of the crystals. The mold was placed in a furnace at ~350° C. for 3.0 hours to cure the epoxy. The resulting composite actuator is shown in FIG. 16.

This result shows that crystals of cubic morphology can be grown in the composition system $(0.90)Na_{(1/2)}Bi_{(1/2)}TiO_3$—$(0.10)BaTiO_3$. It also shows that a oriented multi-crystal actuator can be fabricated by assembling a large number of individual crystals grown in a faceted morphology against a common surface. The resulting composite actuator is 1–3 composite (one-dimensional connectivity for the crystals and a connectivity in three dimensions for the epoxy matrix).

EXAMPLE 5

Growth of a Textured Polycrystalline Piezoelectric

Growth of a composition $(0.85)Na_{(1/2)}Bi_{(1/2)}TiO_3$—$(0.15)K_{(1/2)}Bi_{(1/2)}TiO_3$ was conducted according to the method described in Example 1. The components used and the amounts given in the following table:

| Compound | Manufacturer | Amount (g) | Comments |
|---|---|---|---|
| $Bi_2O_3$ | Alfa Aesar | 65.6060 | includes 20 wt % of component |
| $Na_2CO_3$ | Alfa Aesar | 12.6845 | includes 20 wt % of component |
| $TiO_3$ | Fluka | 37.4891 | |
| $K_2CO_3$ | Alfa Aesar | 2.4324 | |

Crystal growth was conducted as described for Example 1. The furnace schedule was as follows: 13.5 hour ramp from room temperature to 1350° C., hold for 5 hours, cool slowly at a rate of 5° C./min to 800° C., then fnace-cool to room temperature.

Figure 17:
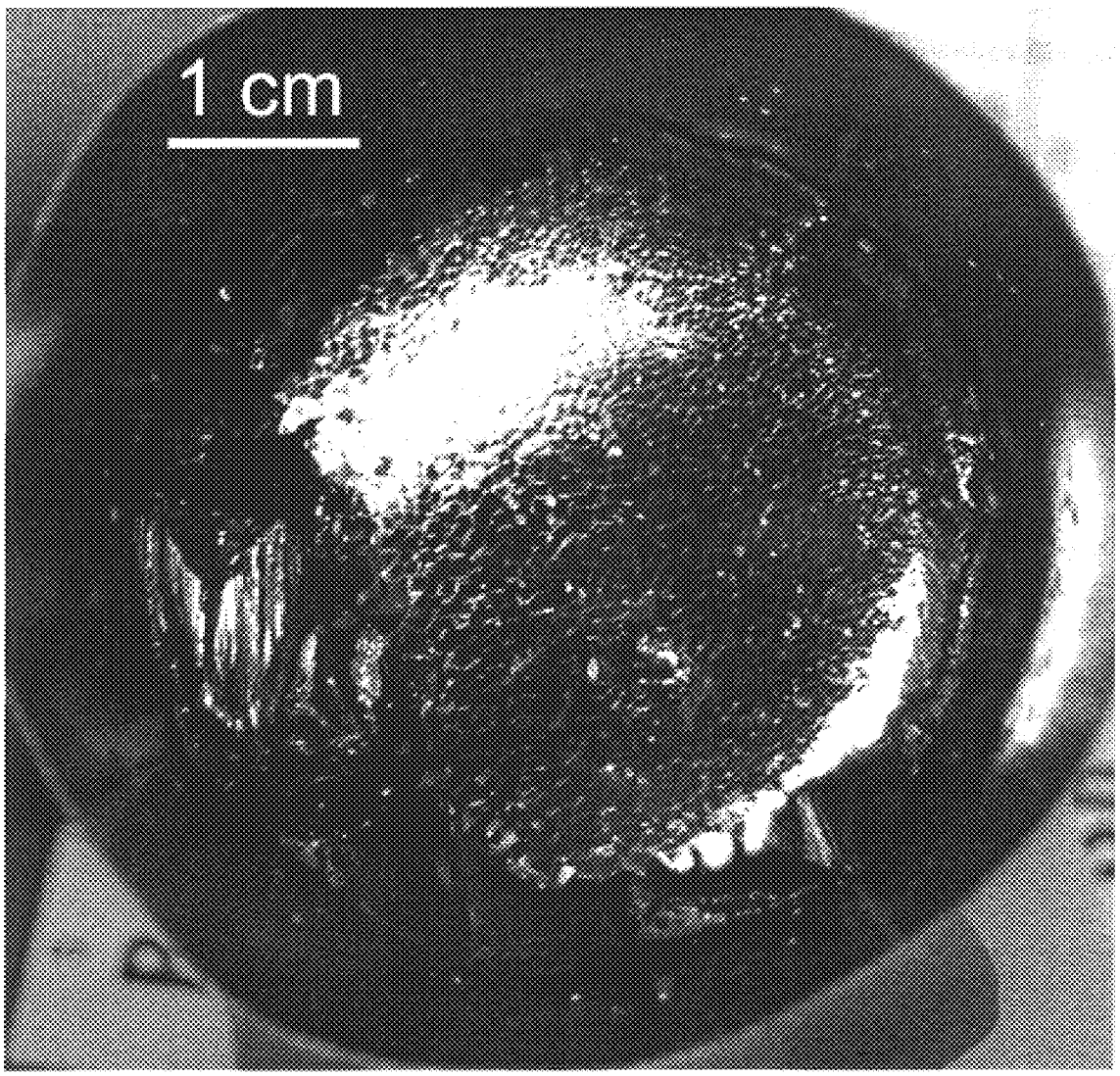
FIG. 17 is a photograph of a crystal mass grown from Example 5.
Figure 18:
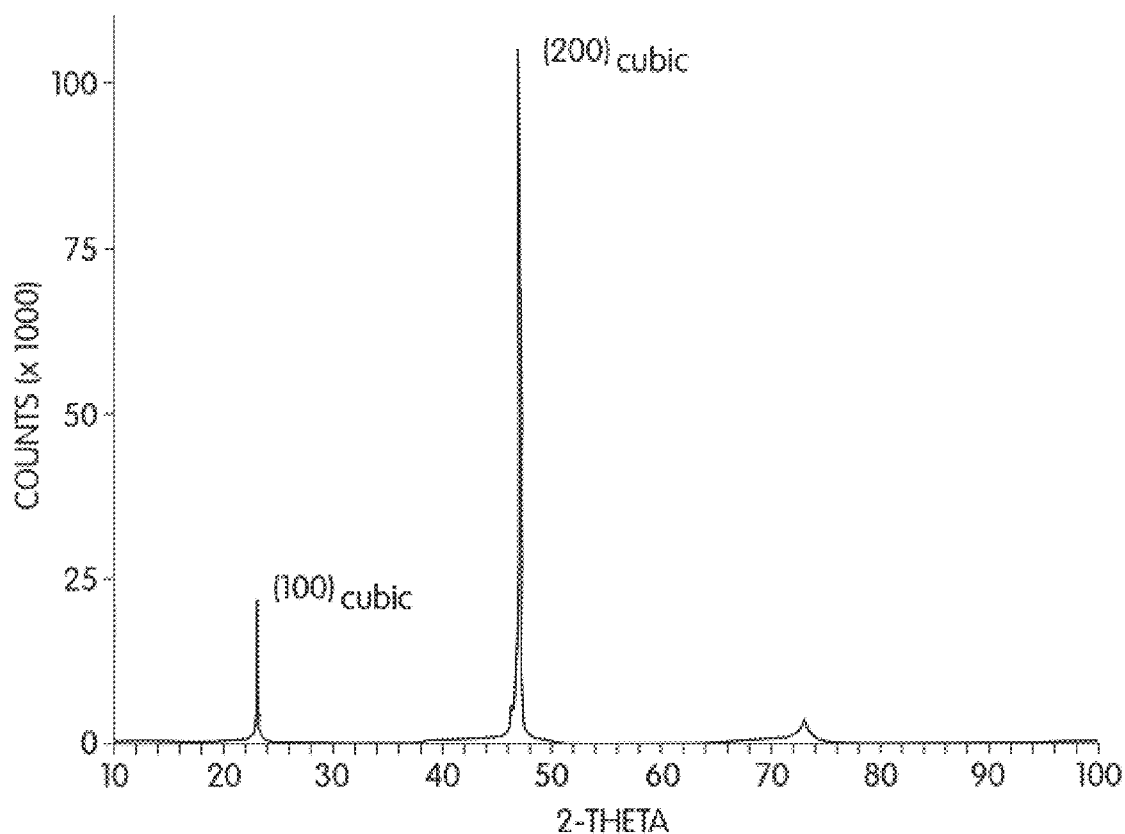
FIG. 18 is an XRD pattern of the crystal mass of FIG. 17, demonstrating crystallographic texturing of the polycrystals.

The nominal composition is in the rhombohedral phase field of the NBT-KBT system. After growth, a large flat area (about 6 square centimeters) of densely packed smaller crystals of uniform size (1–2 mm diameter) were observed at the surface of the original melt, as shown in FIG. 17. Underneath the layer of crystals were numerous larger crystals of cubic growth habit. The surface layer of crystals was removed and examined by X-ray diffraction. The resulting diffraction pattern is shown in FIG. 18. The strongest reflections observed are those for the (100) and (200) reflections of the corresponding cubic phase. There is a striking absence of almost all other reflections. This shows that the layer of small crystallites is highly textured, with the {100} planes of the cubic crystals all oriented parallel to the surface of the melt. A large area (~1 inch diameter) of the layer of aligned crystals was removed intact and infiltrated with epoxy to fabricate a composite actuator.

It is understood that the smaller crystals nucleated spontaneously and floated to the top of the melt, and that the liquid surface served as the alignment surface. The result shows that, firstly, single crystals of cubic morphology can be grown in the $(0.85)Na_{(1/2)}Bi_{(1/2)}TiO_3$—$(0.15)K_{(1/2)}Bi_{(1/2)}TiO_3$ system. Secondly, it is shown that alignment against a surface during the growth of faceted crystals can be used to achieve a crystallographically textured array of multiple crystals. Thirdly, such a textured array can be fabricated into a piezoelectric actuator composite, for instance by infiltration with a polymer.

EXAMPLE 6

Single Crystal Growth in $Na_{(1/2)}Bi_{(1/2)}TiO_3$—$BaTiO_3$.

A powder mixture of the target composition $(0.92)1Na_{(1/2)}Bi_{(1/2)}TiO_3$—$(0.08)BaTiO_3$ was prepared, with 20 wt % each of $Na_2CO_3$ and $Bi_2O_3$ being added in excess in order to form a liquid flux. The powder mixture was prepared from the following starting materials in the following amounts:

| Compound | Manufacturer | Amount (g) | Total, including flux addition |
|---|---|---|---|
| $Bi_2O_3$ | Morton Thiokol | 50.1804 | 60.2165 |
| $Na_2CO_3$ | MCB Reagents | 11.4144 | 13.6973 |
| $TiO_2$ | NanoTek | 37.4014 | |
| $BaTiO_3$ | Morton Thiokol | 7.3925 | |

The powders were ball-milled in a 500 mL polypropylene bottle containing 50% by volume of zirconia milling media and ~80 mL ethanol for ~17 hours at a rolling speed of 120 rpm. The mixed powder was dried with a heating lamp, then ground in a mortar and pestle, then placed in an alumina crucible (100 mL) with a cover and calcined in air according to the following heating schedule: ramp rate of 100° C./hr from room temperature to 800° C., hold for 2 hours, ramp down to 20° C. at 100° C./hr. The powder was removed from the crucible and ground in a mortar and pestle, then placed in a 100 mL platinum crucible, covered with a platinum lid and then placed within a 250 mL alumina crucible and covered with an alumina lid. The sample was placed in a Thermolyne 47900 furnace and fired according to the following crystal growth schedule: ramp rate of 100° C./hr from room temperature to 1350° C., hold for 5 hours, ramp rate of 5° C./hr to 800° C., ramp rate of 50° C./hr to 25° C.

This growth process resulted in a textured raft of small (~1 mm) crystals on the surface of the growth material, further demonstrating the method of Example 5. Beneath the textured polycrystals were many lager single crystals. The crystals were mechanically removed from the crucible and the residual solidified flux was dissolved by immersing in hydrochloric acid for 2 days, after which the crystals were removed and washed with water.

Numerous crystals were tested. The crystals were oriented and polished with diamond abrasive paper of successively finer grit size (30,6 and 0.5 μm) using a South Bay Technology tripod polisher. Gold was sputtered on both faces of the polished crystal plates as electrodes. Silver paint was applied over the gold layer. The capacitance of each crystal was measured using an HP 4194-A impedance analyzer, and the dielectric constant was determined from the capacitance and crystal dimensions. Where desired, the crystals were poled by immersing in an insulating oil bath at 100° C. and poled at twice the coercive field for 10 minutes.

A laser-interferometric strain measurement apparatus was used to measure the piezoelectric strain at room temperature as a function of electric field, at an ac frequency of 1 Hz.

Table I lists the compositions as determined by electron microprobe microanalysis, and phases of some of the samples as determined by XRD. The samples having designations with the prefix BNT_08 are from the growth run described in this Example. Those samples having designations with the prefix BNT10 were grown in a similar manner except that the nominal Ba concentration was increased to 10 mole % (i.e., the target composition is $(0.90)Na_{(1/2)}Bi_{(1/2)}TiO_3$—$(0.10)BaTiO_3$). Those having designations with prefixes XT are from Example 1. In Example 1, sample 1 corresponds to sample XT1 and sample 2 corresponds to XT22 of Table I. NBT is from a similar growth but without $BaTiO_3$ doping. NKB is from Example 2. The composition of each crystal is also given in Table I, as determined by electron microprobe microanalysis using rutile $TiO_2$, albite $NaAlSi_3O_8$, bismuth germanate $Bi_4Ge_3O_{12}$, $BaSO_4$, and $KAlSi_3O_8$ standards. The relative accuracy of the compositions given is better than 5% of the stated values.

<001> directions of the corresponding cubic phase. The splitting of the peaks clearly shows that it is of the tetragonal phase. Although FIG. 20 indicates this crystal as being a perovskite structure in the view taken from the oriented crystal face, the composition of the crystal, given in Table I, indicates that is is not a simple perovskite, but instead is an Na-deficient, non-stoichiometric solid solution.

Figure 4:
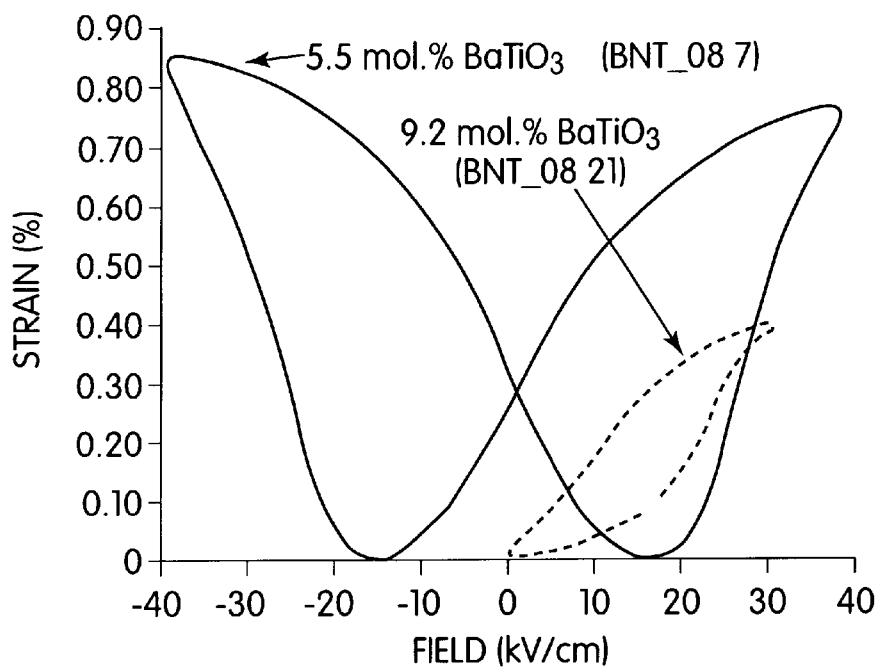
FIG. 4 is a graph of microstrain vs. field strength for tetragonal phase ferroelectric crystals actuated along pseudocubic <100> directions at room temperature.

The BNT_08 7 crystal was poled with a dc field of 3.1 kV/mm for 10 minutes at 100° C. FIG. 4 shows the strain vs. electric field behavior of this crystal to the highest field which was applied in testing. A strain of 0.85% at 3.8 kV/mm was obtained. The hysteresis observed is typical of a domain-switching ferroelectric. The hysteresis curve indicates that the strain had not yet saturated, and that even higher strains could have resulted had a higher field strength been applied. When the crystal was tested at low field

TABLE I

Crystal Compositions and Phases

| Crystal | mole % Na | mole % Bi | mole % Ti | mole % O | mole % Ba | Na/Bi | Na + Bi + Ba | (Na + Ba + Bi)/Ti | XRD |
|---|---|---|---|---|---|---|---|---|---|
| XT1 | 45.9 | 48.6 | 104.2 | 298.1 | 3.2 | 0.9444 | 0.977 | 0.9376 | — |
| XT9 | 50 | 47.6 | 106.1 | 293.5 | 2.7 | 1.0504 | 1.003 | 0.9453 | R |
| XT16 | 49.1 | 46.8 | 105.2 | 295.8 | 3.1 | 1.0491 | 0.99 | 0.9411 | — |
| XT20 | 48.93 | 39.86 | 102.25 | 298.86 | 10.11 | 1.2275 | 0.989 | 0.9672 | — |
| XT21 | 53.09 | 45.06 | 100.42 | 298.51 | 3.21 | 1.1782 | 1.0136 | 1.0094 | R |
| XT22 | 45.9 | 45.1 | 107.9 | 291.5 | 9.6 | 1.0177 | 1.006 | 0.9323 | T |
| XT32 | 52.58 | 44.99 | 101.1 | 298.62 | 2.71 | 1.1687 | 1.0028 | 0.9919 | R |
| XT37 | 51.6 | 44.26 | 102.05 | 299.19 | 2.89 | 1.1658 | 0.9875 | 0.9677 | — |
| XT40 | 53.52 | 42.74 | 102.04 | 298.32 | 3.38 | 1.2522 | 0.9964 | 0.9765 | R |
| XT44 | 50.24 | 45.3 | 101.3 | 299.39 | 3.78 | 1.1090 | 0.9932 | 0.9805 | — |
| NBT2 | 54.57 | 45.09 | 101.75 | 298.49 | 0 | 1.2105 | 0.9966 | 0.9795 | R |
| NKB1 | 36.5 | 34.95 | 96.815 | 305 | 26.2 | 1.0443 | 0.9825 | 1.0148 | T |
| NKB7 | 37.1 | 34.9 | 94.15 | 309.4 | 23.95 | 1.0630 | 0.965 | 1.0250 | T |
| BNT_08 2 | 46.98 | 44.75 | 101.53 | 301.29 | 6.55 | 1.0498 | 0.9828 | 0.9680 | — |
| BNT_08 3 | 46.71 | 45.47 | 101.12 | 300.22 | 6.47 | 1.0273 | 0.9865 | 0.9756 | — |
| BNT_08 6 | 50.19 | 45.67 | 100.57 | 299.16 | 4.41 | 1.0990 | 1.0027 | 0.9970 | — |
| BNT_08 7 | 29.94 | 45.79 | 109.66 | 308.78 | 5.82 | 0.6539 | 0.8155 | 0.7437 | T |
| BNT_08 9 | 48.85 | 44.62 | 101.86 | 299.83 | 4.83 | 1.0948 | 0.98 | 0.9621 | R |
| BNT_08 10 | 46.48 | 44.36 | 102.35 | 300 | 5.52 | 1.0478 | 0.9636 | 0.9415 | R |
| BNT_08 1 | 48.75 | 46.29 | 101.3 | 300.02 | 3.65 | 1.0531 | 0.9869 | 0.9742 | — |
| BNT_08 21 | 47.49 | 43.06 | 101.23 | 300 | 9.18 | 1.1031 | 0.9973 | 0.9852 | T |
| BNT10 2 | 46.96 | 43.65 | 102.2 | 300.26 | 6.92 | 1.0758 | 0.9753 | 0.9543 | T |
| BNT10 3 | 46.3 | 44.75 | 102.3 | 300.74 | 5.91 | 1.0346 | 0.9696 | 0.9478 | — |
| BNT10 5 | 47.13 | 45.32 | 101.62 | 300.34 | 5.59 | 1.0399 | 0.9804 | 0.9648 | — |
| BNT10 6 | 47.16 | 44.44 | 101.6 | 300.13 | 6.66 | 1.0612 | 0.9826 | 0.9671 | T |
| BNT10 7 | 48.29 | 44.73 | 101.83 | 300 | 5.15 | 1.0796 | 0.9817 | 0.9641 | — |
| BNT10 A | 44.79 | 44.85 | 103.04 | 301.56 | 5.76 | 0.9987 | 0.954 | 0.9259 | — |
| BNT10 C | 48.97 | 45 | 101.03 | 299.52 | 5.47 | 1.0882 | 0.9944 | 0.9843 | — |
| BNT10 E | 50.47 | 45.03 | 100.18 | 298.73 | 5.59 | 1.1208 | 1.0109 | 1.0091 | — |

R = Rhombohedral; T = Tetragonal

FIG. 21 illustrates the strain vs. electric field behavior at room temperature for several rhombohedral phase crystals, showing the low hysteresis and high strain that is attainable in solid solutions of the present invention. The crystal NBT2 which is an undoped NBT is seen in FIG. 21 to be hysteretic and to have modest strain, reaching 0.1% at about 60 kV/cm. The crystal XT21 contains 3.21 molar % $BaTiO_3$ and shows low hysteresis actuation above a coercive field of about 16 kV/cm. The crystal BNT_08 10 contains 5.55 molar % $BaTiO_3$ and is near the MPB. It is actuated with an AC field about a DC bias field of 30 kV/cm. It shows low hysteresis actuation reaching a high strain of about 0.24% at 60 kV/cm, and exhibits a $d_{33}$ of about 400 pC/N.

Figure 19:
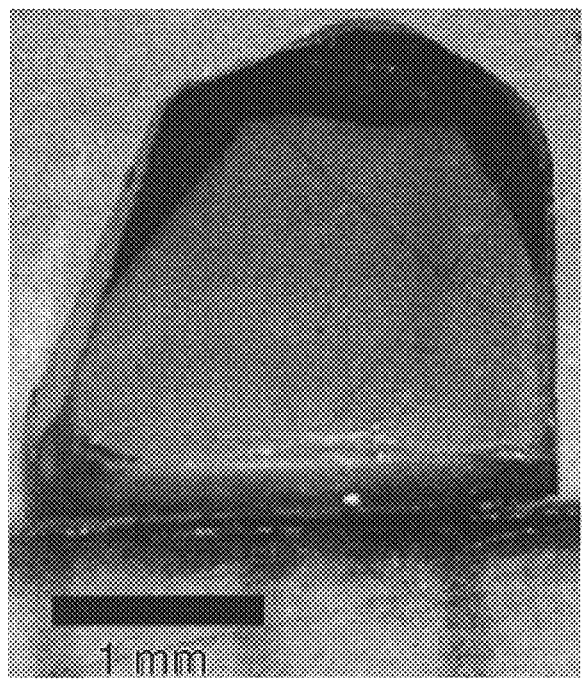
FIG. 19 is a photomicrograph of a high strain single crystal of the invention.
Figure 20:
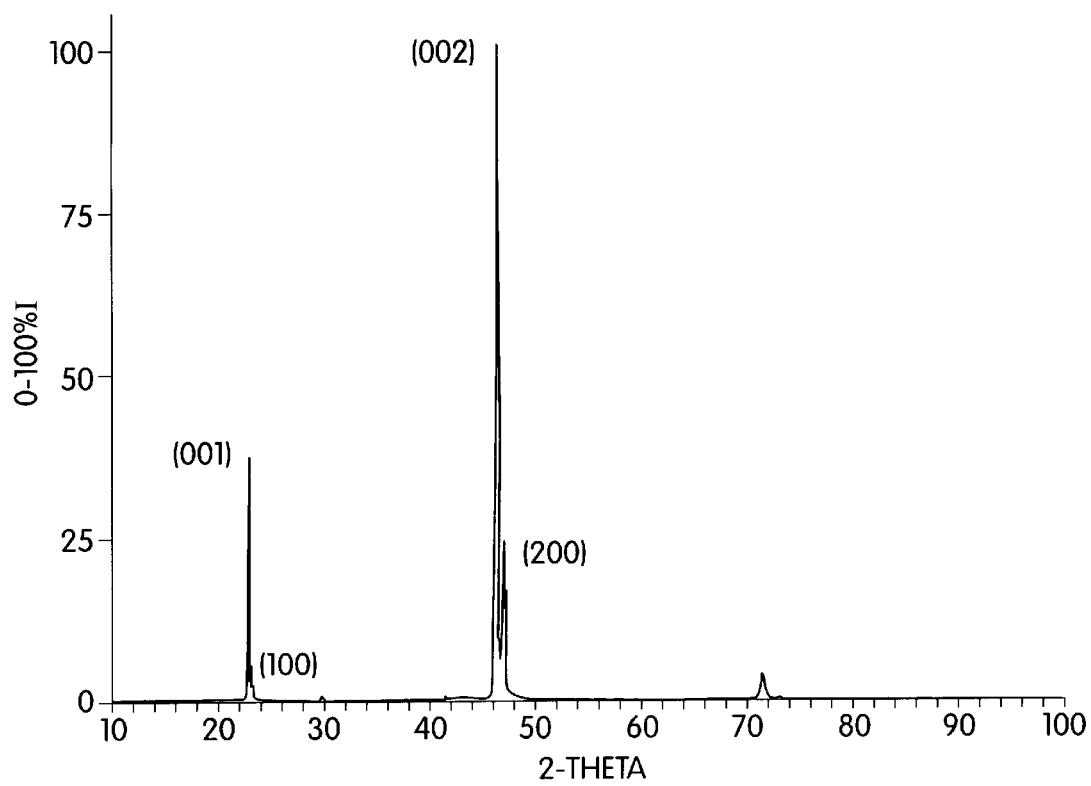
FIG. 20 is an XRD pattern of the single crystal of FIG. 19.

Of all the tested crystals, that crystal designated as BNT_08 7 was found to exhibit the highest piezoelectric strain. This crystal is shown in FIG. 19. An X-ray diffractogram taken from the oriented crystal face is shown in FIG. 20. Only (001)/(100) and (002)/(200) reflections are seen, showing that the crystal is oriented with its faces normal to the strengths, the slope of the strain vs. field curves showed a $d_{33}$ value of 360 pC/N. This experimentally indicates that the majority of the actuation strain achieved was due to domain re-orientation within the tetragonal phase.

This result is a significant advance over the actuation levels that are typically attainable in commercial PZT solid solutions such as 5H, 5A, 4S, and 8M, which generally reach at most about 0.45% strain at a field of about 3.8 kV/mm. This result further confirms the superiority of the family of compositions described herein and indicates that within the family of compositions, the subclass of compositions as defined above can be expected to produce particularly superior characteristics.

In comparison, in Example 1 a tetragonal single crystal in the $Na_{1/2}Bi_{1/2}TiO_3$—$BaTiO_3$ subclass of the compositional family was experimentally found to reach a strain of about 0.2% at 7.73 kV/mm, and in Example 2, a tetragonal single crystal in the $Na_{1/2}Bi_{1/2}TiO_3$—$K_{1/2}Bi_{1/2}TiO_3$—$BaTiO_3$ subclass of the compositional family was experimentally found to reach a strain of about 0.4% at 4.8 kV/mm. In FIG. 4, the crystal containing 9.2 molar % $BaTiO_3$ is crystal BNT_08 21 having a composition $Na_{0.475}Bi_{0.431}Ba_{0.092}Ti_{1.012}O_3$. The crystal reaches a strain of about 0.4% at 30 kV/cm when actuated with an AC field about a DC bias of 15 kV/cm. The thickness-mode coupling coefficient of this crystal was measured using the resonance-antiresonance method and was determined to be $k_1$=57%, which is superior to that of polycrystalline NBT-based materials and approaches that of the best single crystals in the PZN-PT and PMN-PT family. This further demonstrates the utility of the present invention.

Considering the composition of the crystal designated as BNT_08 7, as given in Table 1, it is seen that it includes 5.82 mole % Ba, which is near the morphotropic phase boundary composition in stoichiometric crystals. However, this crystal is clearly Na deficient with respect to the stoichiometric composition of $Na_{1/2}Bi_{1/2}TiO_3$—$BaTiO_3$, having an Na/Bi ratio that is 0.654 rather than the ideal stoichiometric value of 1.0, a total Na+Bi+Ba molar concentration of 0.8155 per formula unit rather than 1.0, and a (Na+Ba+Bi)/Ti ratio of 0.744 rather than 1.0. While some of the other crystal compositions given in Table 1 also vary away from the ideal cation stoichiometry of the composition $Na_{1/2}Bi_{1/2}TiO_3$, it is clear that the crystal designated BNT_08 7 is exceptional in its deviation from stoichiometry, and that this deviation from stoichiometry can be directly correlated to the exceptional piezoelectric properties exhibited by the crystal.

The crystals designated as BNT10C and BNT10E in Table 1 are two slices cut from the same large crystal. The Ba concentrations are 5.47% and 5.59%, respectively, both of these being close to the morphotropic phase boundary composition. The actuation strain vs. applied field for these two crystals we shown in FIGS. 22 and 23 respectively.

Figure 22:
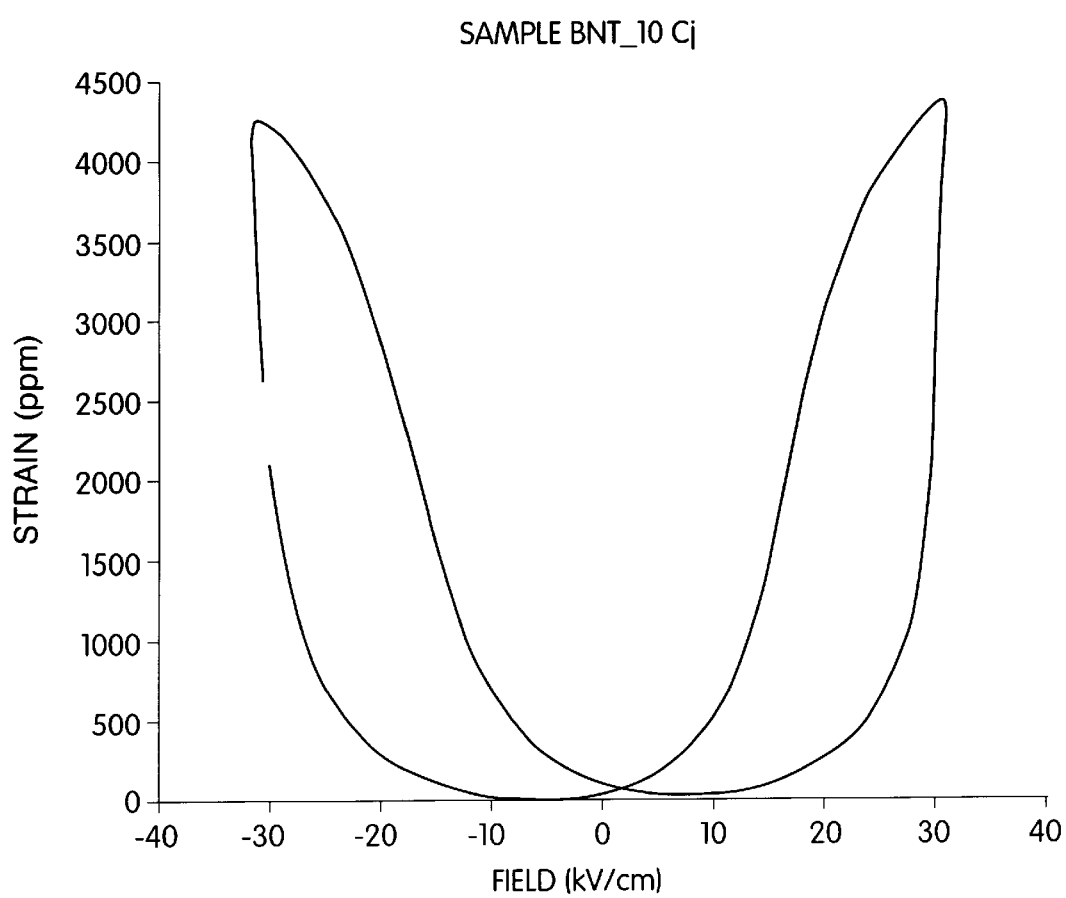
FIG. 22 is a plot of microstrain vs. applied field for the crystal designated as BNT10C in Table I and having a Ba concentration of 5.47%.
Figure 23:
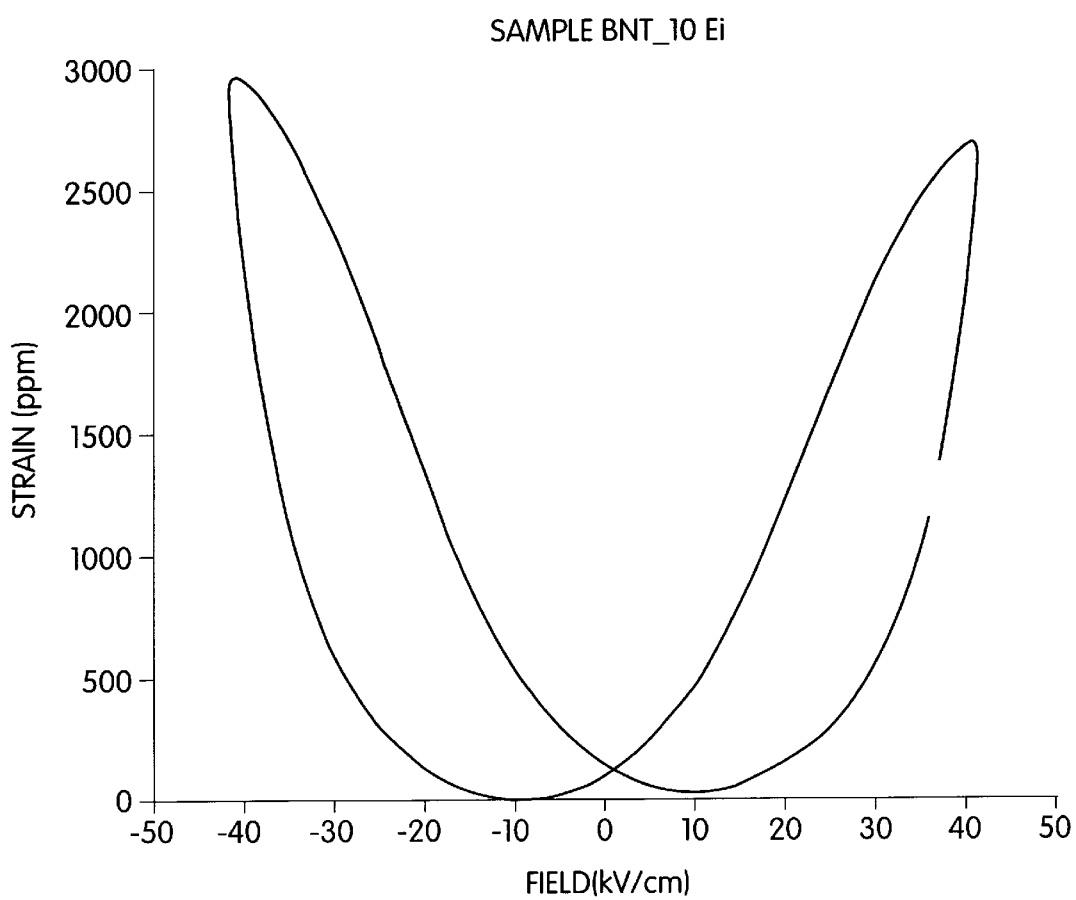
FIG. 23 is a plot of microstrain vs. applied field for the crystal designated as BNT10E in Table I and having a Ba concentration of 5.59%.
Figure 24:
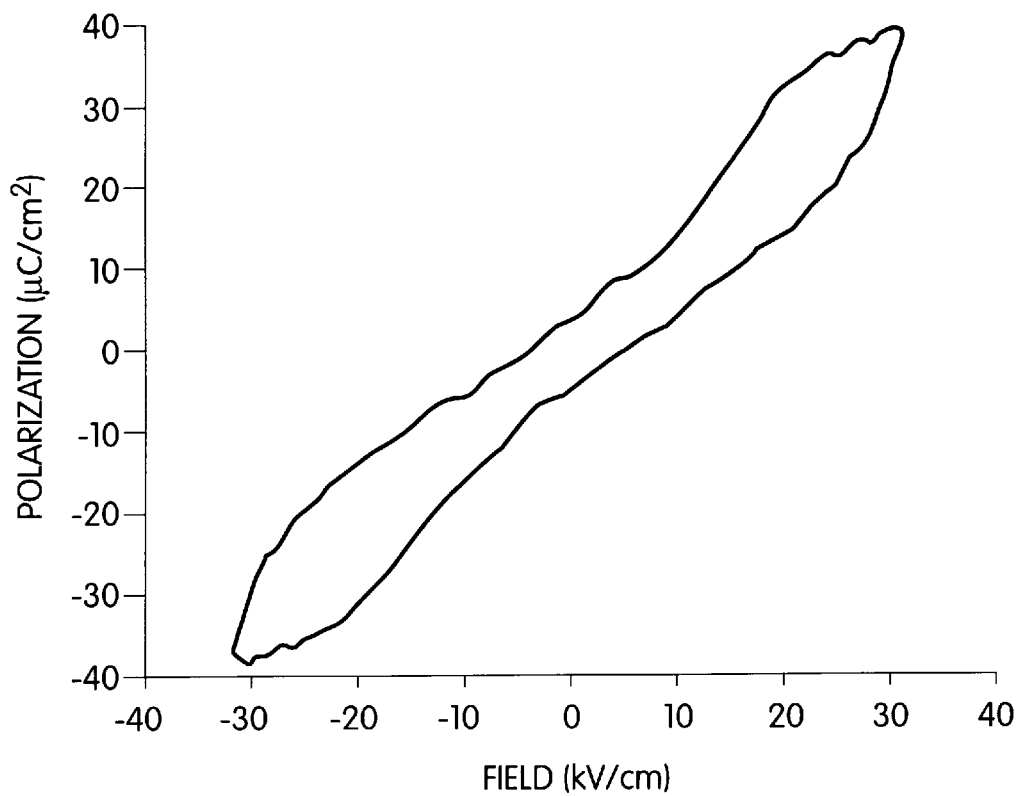
FIG. 24 is a plot of polarization vs. electric field loop for the single crystal of FIG. 22.

It is seen that these two crystals at room temperature exhibit a sharp onset of actuation strain, at a field of approximately 3 kV/mm and 4 kV/mm respectively, reaching a maximum strain of 0.44% and 0.3% respectively. This behavior is characteristic of a field-forced antiferroelectric to ferroelectric phase transition, and has previously been seen in Pb—La—Sn—Zr—Ti—O perovskites. The invention provides the discovery of such behavior in a lead-free single crystal perovskite, and in the NBT-BT system at room temperature. The polarization vs. electric field loop corresponding to FIG. 22, shown in FIG. 24, has a shape characteristic of a field-forced AFE-FE phase transition. The actuation strains achieved are approximately equal to those of conventional ferroelectric PZT's, and exceed those in Pb—La—Sn—Zr—Ti—O polycrystals exhibiting AFE/FE phase change behavior. The Example thus provides a recognition and an experimental demonstration that single crystals in the $Na_{1/2}Bi_{1/2}TiO_3$—$BaTiO_3$ system posses AFE/FE-like actuation behavior with high actuation strain. The Example correspondingly provides the discovery of a room temperature antiferroelectric phase in the $Na_{1/2}Bi_{1/2}TiO_3$—$BaTiO_3$ system with useful actuation properties.

EXAMPLE 7

Zr-doped $Na_{1/2}Bi_{1/2}TiO_3$ Single Crystals.

Crystal growth was conducted as described in Example 1, but including 5% substitution of Zr for Ti in the target composition. This was accomplished by adjusting the overall compositions so as to reduce the Ti concentration to 95% of the value for $Na_{1/2}Bi_{1/2}TiO_3$ and adding $ZrO_2$ in a quantity yielding 5% Zr by mole. The crystal growth was successful, and yielded many crystals ranging in size from 1 mm to 10 mm. One crystal from this growth was analyzed and found to contain 5.5% Zr, e.g., $Na_{0.5}Bi_{0.5}Ti_{0.055}O_3$. This experiment indicates in accordance with the invention that single crystals can be grown with partial substitution of Zr for Ti in the parent compounds of the family of compositions provided by the invention.

This aspect of the invention is significant in that single crystals of Zr-containing perovskites are known in the art to be extremely difficult to grow. For example, PZT single crystals are not widely available. The results show that substitution onto the B site (the Ti site) of the alkaline bismuth titanate perovskites is possible, as prescribed by the invention, thereby allowing for a broad range of additional composition families.

EXAMPLE 8

Cs-Doped $Na_{1/2}Bi_{1/2}TiO_3$ Single Crystals.

To experimentally confirm that substitution onto the A-site (the Na and Bi sites) of $Na_{1/2}Bi_{1/2}TiO_3$ single crystals is possible, crystal growth was conducted as described in Example 1, but with 5% substitution of Cs for Na in the target composition. The crystal growth was successful, and yielded many crystals ranging in size from a few mm to greater than 10 mm in a single growth run. This experimentally confirms the discovery provided by the invention of a process for growth of single crystals with partial substitution of heavier alkali metals such as Rb and Cs for Na in the parent $Na_{1/2}Bi_{1/2}TiO_3$ or $K_{1/2}Bi_{1/2}TiO_3$.

The invention thereby also provides alkaline bismuth titanate solid solutions with Rb or Cs substituted for Na or K, the single crystal form of such compounds, and growth methods as described herein. It also comprises other A-site substitutions as described above.

EXAMPLE 9

Growth of a Textured Polycrystalline Piezoelectric in the PZN-PT System.

The invention here further provides a method for achievement of the growth of textured polycrystals in other perovskite systems such as the PZN-PT material system. This experimentally provides further evidence that the method of growth provided by the invention can be broadly applied to may crystal systems.

A target crystal composition of 0.80 $Pb(Zn_{1/3}Nb_{2/3})O_3$—0.20$PbTiO_3$ was formulated using the following starting materials:

| | | |
|---|---|---|
| Lead (II) oxide, PbO | Alfa Aesar, Ward Hill, MA | 99.99% purity |
| Zinc Oxide, ZnO | MCB Manufacturing Chemists Inc. Cincinnati, OH | 99.99% purity |
| Titanium (IV) oxide, $TiO_2$ | Fluka AG, CH-9470 Buchs, Switzerland | >99% purity |
| Niobium (V) Oxide, $Nb_2O_5$ | Alfa Aesar, Ward Hill, MA | 99.9+% purity |
| To this was added the following as a flux-forming agent: | | |
| Lead (II, III) oxide, $Pb_3O_4$ | Cerac Speciality Inorganics, Milwaukee, WI | 99.99% |

The molar ratio of the target crystal composition and the flux was 35:65, and the batch size consisted of 450 g of starting powder. The raw powders were mixed for 12 hours in a V-blender. The mixed powders were fired at 900° C. in a 100 mL platinum crucible, then placed in a 200 mL alumina crucible and sealed with an alumina lid, using OmegaBond™ "400" high temperature air-set cement. The batch was then heated to 1150° C., held there for 2 hours, then cooled at a rate of 2° C./h to 900° C., whereupon it was cooled to room temperature at a rate of 50° C./h.

Figure 25:
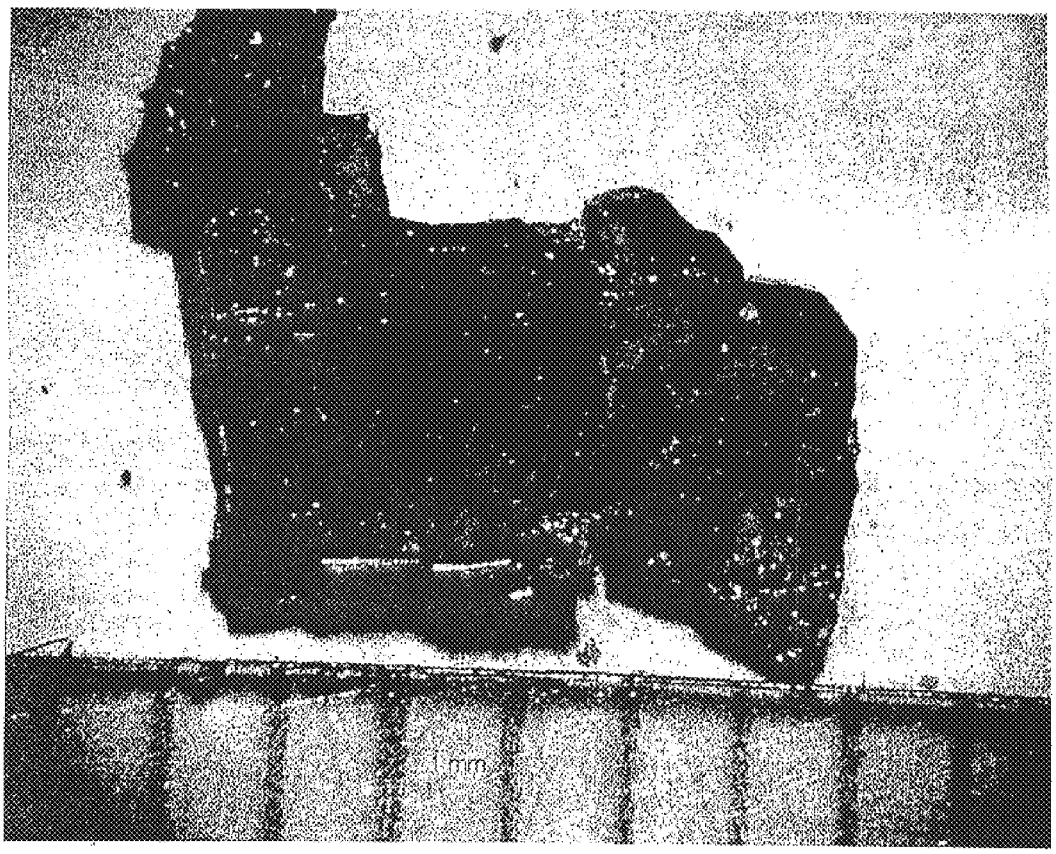
FIG. 25 is a photomicrograph of numerous textured PZN-PT crystals grown according to the method of the invention.

The crystal growth process resulted in formation of numerous PZN-PT crystals of several mm to 1 cm diameter. At the top of the growth mass, an assemblage of textured crystallites was observed. These are shown in FIG. 25. This result provides additional experimental confirmation of the process provided by the invention of growing a textured polycrystal by nucleating smaller faceted crystals and allowing them to align against a surface. It further experimentally confirms that a range of textured polycrystal material systems can be produced by the method provided by the invention, and indeed, this growth technique can be generally applied to a process in which crystals are to be grown from a liquid. This experiment in itself is thus not meant to be limiting but instead to be demonstrative of the techniques contemplated by the invention.

EXAMPLE 10

Diffraction analysis of high strain tetragonal crystal.

Figure 26:
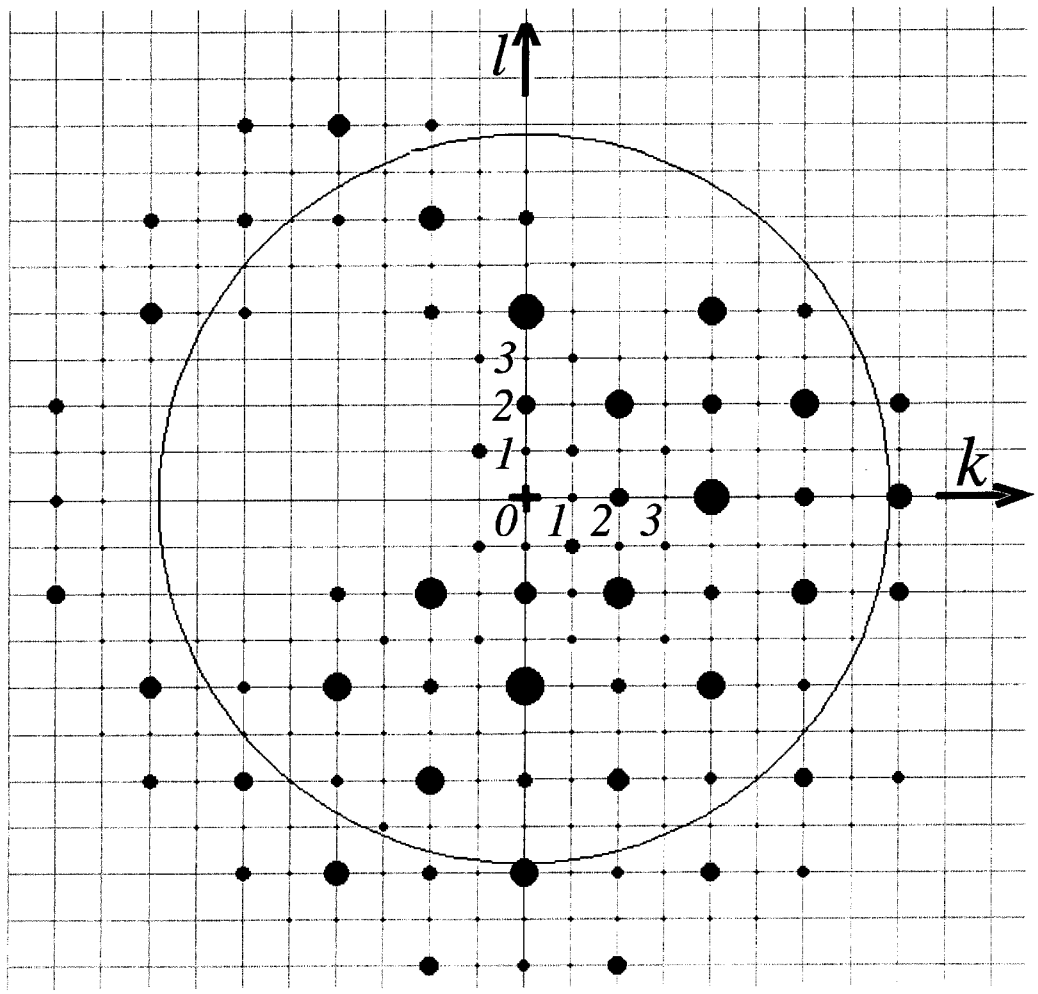
FIG. 26 is a reciprocal lattice net diffraction pattern for crystal designated as NBT_08 3.

Single crystal X-ray diffraction experiments were conducted using Mo-radiation on Siemens SMART CCD Single Crystal Diffractometer (Bruker AXS Inc., Madison, Wis.) and the diffraction data were analyzed using Siemens SMART software package. An irregular shaped 0.2 mm in size piece of NBT_08 3 crystal was analyzed. As a result, the lattice symmetry and parameters were determined and the intensity-weighted reciprocal lattice net was built. Due to a presence of multiple ferroelectric domains the sample was analyzed as having triclinic symmetry with a slight distortion from a cubic symmetry: cell edges 7.813, 7.818 and 7,808 A and cell angles 89.98°, 89.99° and 90.00°. It should be noted that the cell size is doubled compared to a simple perovskite structure having the cell size of ~4 A. This doubling of the unit cell is caused by a long range ordering and is manifested by the superlattice reflections present on the intensity-weighed reciprocal lattice net FIG. 26 presents a 0-layer of the reciprocal lattice net. The superlattice reflections are those situated on the odd index grid-lines. The reciprocal lattice pattern indicates that the supercell is primitive: no systematic absences are observed. The crystal NBT_08 7 showed qualitatively identical results with a lower peak to background ratio in the diffraction patter.

Figure 27:
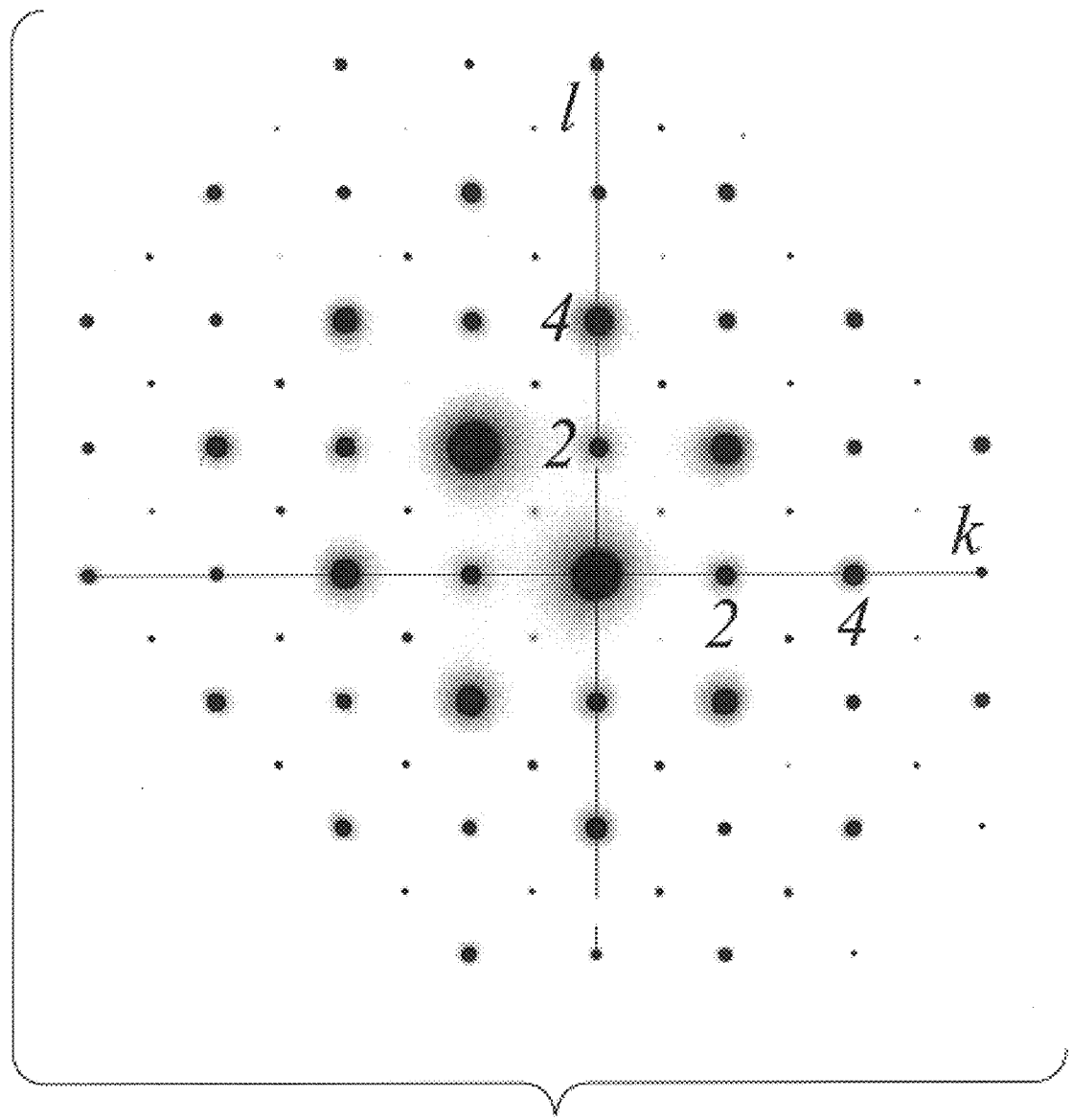
FIG. 27 is a electron diffraction pattern for crystal with double cell indexing designated as NBT_08 25.

Electron diffraction experiments were conducted using transmission electron microscope JEOL 2000 FX (JEOL USA Inc., Peabody, Mass.) with 200 kV accelerating voltage. A slice of a crystal NBT_08 25 of composition $Na_{0.501}Bi_{0.444}Ba_{0.078}TiO_3$ was analyzed. Size of the diffraction-producing region was about 1 μm. FIG. 27 represents the electron diffraction pattern of the sample with double cell indexing. Again, the pattern has superlattice reflections {110). However, {100} reflections are not observed. Systematic absence of {100} reflections indicates that the supercell is body-centered.

Both diffraction experiments show that sodium bismuth titanate doped with barium titanate possesses a superstructure caused by long range ordering. The corresponding supercell has dimensions two times that of the single perovskite cell. The systematic presence of {110} reflections in both diffraction experiments excludes the face-centered, NaCl-type supercell that is the only super-structure previously known in NBT. Thus a long-range ordering of the A-site cations resulting in a primitive or body-centered supercell with twice the lattice parameter of the single perovskite cell is a unique characteristic of the materials exemplifies by this invention. The difference in the results of single crystal diffraction and electron diffraction is due to the difference in composition of the two analyzed samples.

EXAMPLE 11

Growth of Single Crystal Fibers by the EFG Method.

Figure 28:
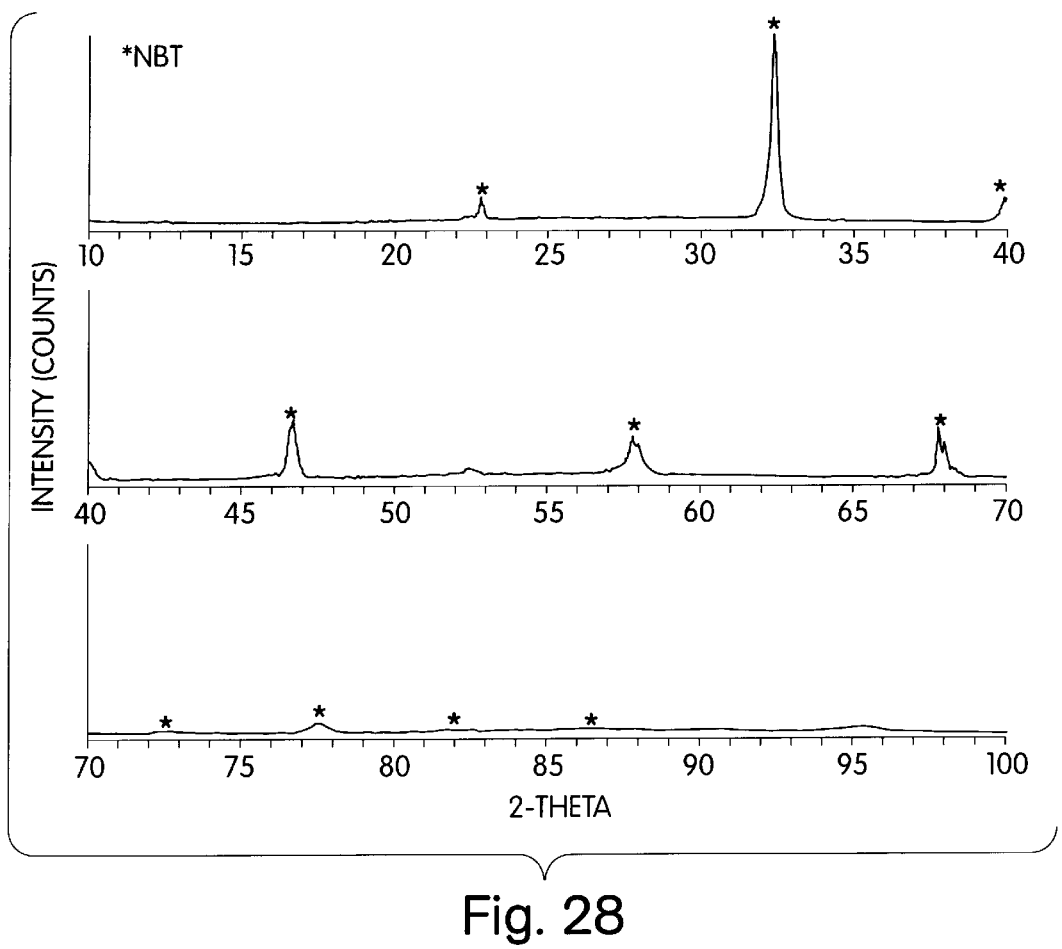
FIG. 28 is an XRD pattern for the congruently melting crystal of Example 11.

Single crystals from previous growth runs in the NBT-BT system containing 5.5 molar % and 10 molar % $BaTiO_3$ and being nearly stoichiometric in cation composition, were tested for congruency of melting. The crystals were sealed in platinum foil containers and melted at 1260° C., then rapidly cooled and examined by X-ray diffraction at 1°/min scan rate. FIG. 28 shows the X-ray diffractogram from the sample containing 5.5 molar % $BaTiO_3$. No diffraction peaks other than those for the perovskite phase are observed, showing that the composition melts congruently. Similar results were observed in the case of the 10% $BaTiO_3$ sample. Thus it is shown that NBT-BT compositions with between 5.5 and 10 molar % $BaTiO_3$ melt congruently. This in turn shows that direct growth of single crystals and fibers from the melt of these doped compositions is in principle possible.

Edge-defined, film-fed growth (EFG) experiments were conducted using a BCG 365 Crystal grower (F. E. Brown (Barrington) & Co., Cambridge, England) equipped with a B-100 RF generator (Lindberg, Chicago, Ill.). A porous ceramic heat insulation was used to reduce heat loss and temperature gradients.

3 g of crystals from the BNT_08 batch were put into a platinum crucible and melted. The cooled melt was covered with a platinum boat-shaped die having 0.3 mm diameter hole. The assembly was heated to ~1330° C. and kept at this temperature. After melting, a 0.3 mm diameter platinum wire was lowered to touch the melt and form a liquid neck with the melt through the hole in the die. When the neck was formed, the wire was pulled up at the rate of 18 mm/hr. Due to the gradient of temperature from the melt to the wire, the crystallization occurred at the melt-wire boundary. The resultant crystal had a cylindrical shape and was ~0.3 mm in diameter and ~4 mm long. Microscopic study of this rod proved it to be polycrystalline.

Figure 29:
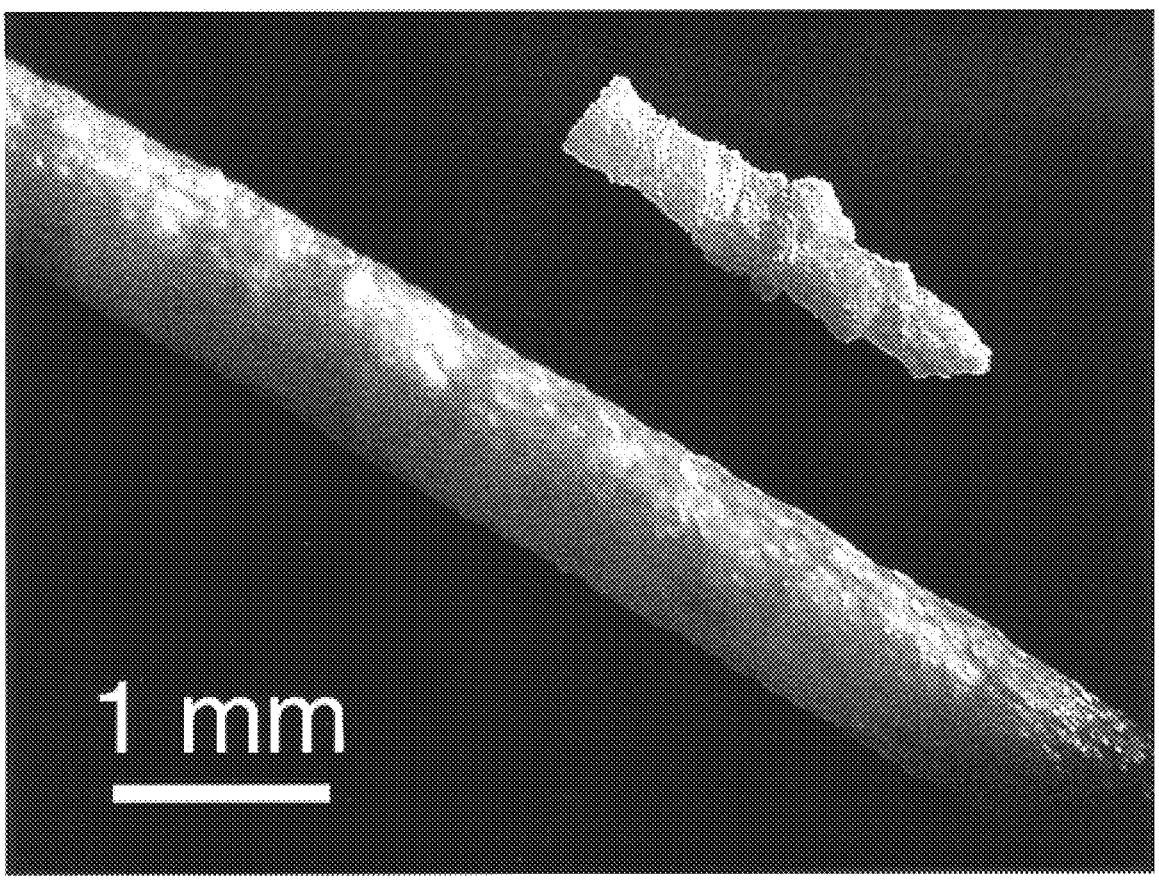
FIG. 29 is photomicrograph of the single crystal fiber of Example 11.

Another EFG experiment was carried out using a platinum die having 0.5 diameter hole and a single crystal from the BNT_08 batch attached to a platinum wire as a seed. The pulling rate was 25 mm/hr. All other conditions were the same as in the previous experiment. The resultant crystal had a cylindrical shape and was 0.8–0.9 mm in diameter and ~60 mm long. Microscopic study of this filament proved it to be a single crystal. The crystals grown in the described two EFG experiments are shown on FIG. 29. Optical microscopy of the polished cross-section of the larger crystal showed ferroelectric domain patterns.

Thus it is shown that the NBT-BT compositions described herein, being congruently melting compounds, can be grown as single crystal fibers.

EXAMPLE 11

Orientation Dependence of Piezoelectric Actuation in Tetragonal Phase Perovskite.

Figure 30A:
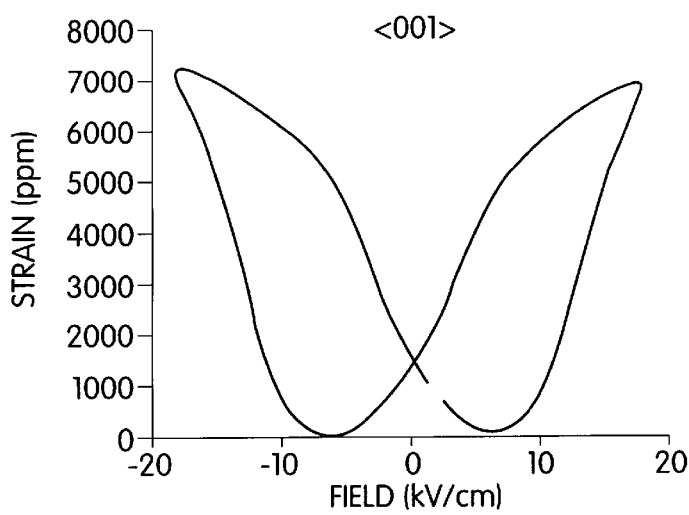
FIG. 30 is a series of plots of electric field-induced strain vs. electric field for (a) <001>, (b) <011>, (c) <111> oriented PZN-PT single crystal plates.
Figure 30B:
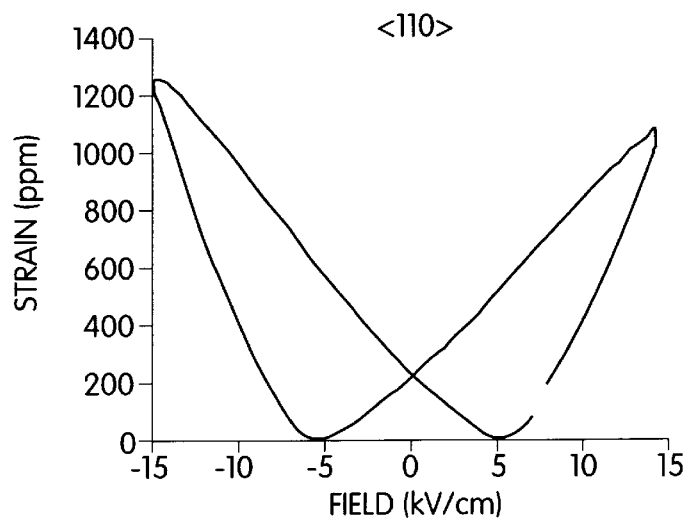
Figure 30C:
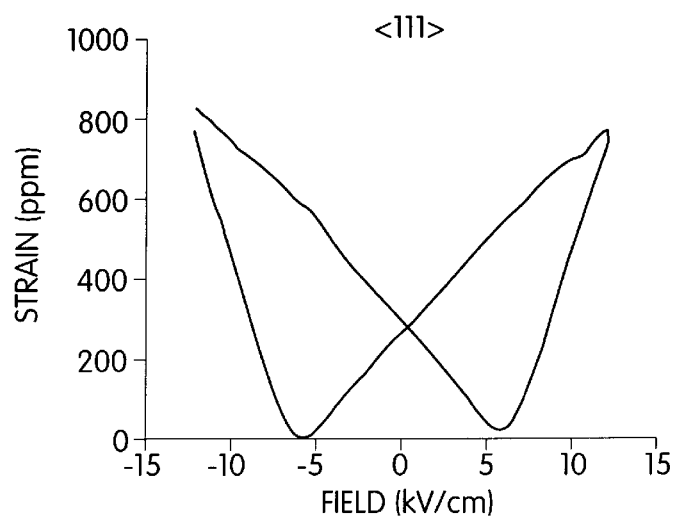

A PZN-PT single crystal of composition $0.89PbZn_{1/3}Nb_{2/3}O_3$—$0.11PbTiO_3$ was grown according to the method of Example 9. X-ray diffraction showed that the crystal was of tetragonal symmetry. The crystal was oriented and cut into three plates, each 0.8 nm thick and 4–5 mm in the other two dimensions. The normals of the faces of the plates were oriented in the <001>, <011> and <111> directions of the corresponding cubic phase, respectively. The plates were electroded on both sides by sputtering about 1 micrometer thick layers of gold. FIG. 30 shows the strain vs. electric field behavior of the three plates. It is clearly seen that the (001) oriented plate has the greatest hysteresis, similar to that seen in FIG. 4. However, the (011) and (111) oriented plates have significantly reduced hysteresis. The decreasing hysteresis is understood to result from a decrease in the maximum possible fraction of ferroelectric domains having their polarization vector at 90° to the direction of the applied field (coincident to the plate normal). Thus, it is shown that actuation of a tetragonal phase perovskite piezoelectric out of the direction of spontaneous polarization results in lower hysteresis actuation. It is expected that poling of the <011> and <111> oriented plates would result in further reduction of the hysteresis.

What is claimed is:

1. A piezoelectric ceramic material, comprising:

a single crystal perovskite material of the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Th, Dy, Ho, Er, Tm, Yb and Lu; and M" is one or more of Ti, Zr, Hf, Sn, Ge, Mg, Zn, Al, Sc, Ga, Nb, Mo, Sb, Ta and W;

where $z \leq 0.1$; $0.9 \leq \gamma \leq 1.1$; $\alpha$, $\beta$ and $\gamma$ are greater than zero; and $(\alpha+\beta+\gamma)$ is in the range of about 0.75 to 1.1.

2. A piezoelectric ceramic material, comprising:

a perovskite material of the formula, $Na_\omega M_\alpha Bi_\beta M'_\gamma M''_\delta O_{3\pm z}$, where M is one or more of K, Rb and Cs; M' is one or more of Ca, Sr, Ba, Pb, Y, La, Pr, Nd, Sm, Eu, Gd, Th, Dy, Ho, Er, Tm, Yb and Lu; M" is one or more of Ti, Zr, Hf, Sn, Ge, Mg, Zn, Al, Sc, Ga, Nb, Mo, Sb, Ta and W;

where $z \leq 0.1$; $0.9 \leq \delta \leq 1.1$; $\alpha$, $\beta$, $\gamma$ and $\omega$ are greater than zero; and $(\alpha+\beta+\gamma+\omega)$ is in the range of about 0.75 to 1.1.

3. The material of claim 1, wherein $(\alpha+\beta+\gamma)$ is in the range of about 0.75 to 0.95.

4. The piezoelectric material of claim 2, wherein M comprises K.

5. The piezoelectric material of claim 1 or 2, wherein M' comprises Ba; M" comprises Ti; and $\gamma$ is in the range of about 0.03–0.12.

6. The piezoelectric material of claim 1 or 2, wherein M' comprises Pb; M" comprises Ti; and $\gamma$ is in the range of about 0.12–0.20.

7. The piezoelectric material of claim 1 or 2, wherein M' comprises Ca; M" comprises Ti; and $\gamma$ is in the range of about 0.12–0.20.

8. The piezoelectric material of claim 1 or 2, wherein M' comprises Sr; M" comprises Ti; and $\gamma$ is in the range of about 0.22–0.35.

9. The piezoelectric material of claim 1 or 2, wherein the material is a single crystallite and the crystallite is a faceted crystal having a selected crystalline plane exposed.

10. The piezoelectric material of claim 12, wherein the exposed plane is the {001} plane of the corresponding cubic phase.

11. The piezoelectric material of claim 1, wherein the parameters $\alpha$, $\beta$ and $\gamma$ are selected such that the perovskite phase has a rhombohedral crystal symmetry.

12. The piezoelectric material of claim 1, wherein the parameters $\alpha$, $\beta$ and $\gamma$ are selected such that the perovskite phase has a tetragonal crystal symmetry.

13. The piezoelectric material of claim 14 or 15, wherein parameters $\alpha$, $\beta$ and $\gamma$ are selected such that the piezoelectric material lies near a morphotropic phase boundary or point.

14. The material of claim 2, wherein $(\alpha+\beta+\gamma+\omega)$ is in the range of about 0.75 to 0.95.

15. The material of claim 1, 2, 3, or 14, wherein the piezoelectric material has a $d_{33}$ value of greater than 200 pC/n.

16. The material of claim 1, 2, 3, or 14, wherein the material exhibits a piezoelectric strain of greater than 0.15%.

17. The material of claim 1, 2, 3, or 14, wherein the material exhibits a low hysteresis of action.

18. A piezoelectric ceramic material, comprising:

a single crystal perovskite material of the formula, $M_\alpha Bi_\beta M'_\gamma M''_\delta O_{3\pm z}$, where M is one or more of Na, K, Rb and Cs; M' is one or more of Ca, Sr, Ba, Pb and La; and M" is one or more of Ti, Zr, Hf Sn, Mg, Zn and Al;

where $z \leq 0.1$; $0.9 \leq \delta \leq 1.1$; $\alpha$, $\beta$ and $\gamma$ are greater than zero; and $(\alpha+\beta+\gamma)$ is in the range of about 0.75 to 1.1.

19. A piezoelectric ceramic material, comprising:

a perovskite material of the formula, $Na_\omega M_\alpha Bi_\beta M'_\gamma M''_\delta O_{3\pm z}$, where M is one or more of K, Rb and Cs; M' is one or more of Ca, Sr, Ba, Pb and La; M" is one or more of Ti, Zr, Hf, Sn, Mg, Zn and Al;

where $z \leq 0.1$; $0.9 \leq \delta \leq 1.1$; $\alpha$, $\beta$, $\gamma$ and $\omega$ are greater than zero; and $(\alpha+\beta+\gamma+\omega)$ is in the range of about 0.75 to 1.1.

20. A piezoelectric material, comprising:

a perovskite material having tetragonal crystal symmetry of the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Th, Dy, Ho, Er, Tm, Yb and Lu; M" is one or more of Ti, Zr, Hf, Sn, Ge, Mg, Zn, Al, Sc, Ga, Nb, Mo, Sb, Ta and W;

where $z \leq 0.1$; $0.9 \leq \delta \leq 1.1$; $\alpha$, $\beta$ and $\gamma$ are greater than zero; $(\alpha+\beta+\gamma)$ is in the range of about 0.75 to 1.1, and $0.32 \leq \beta < 0.5$, the piezoelectric material having an actuation strain of greater than about 0.15% and having a $d_{33}$ of greater than about 150 pC/N.

21. A piezoelectric material, comprising:

a perovskite material having tetragonal crystal symmetry of the formula, $Na_\omega M_\alpha Bi_\beta M'_\gamma M''_\delta O_{3\pm z}$, where M is one or more of K, Rb and Cs; M' is one or more of Ca, Sr, Ba, Pb, Y, La, Pr, Nd, Sm, Eu, Gd, Th, Dy, Ho, Er, Tm, Yb and Lu; M" is one or more of Ti, Zr, Hf, Sn, Ge, Mg, Zn, Al, Sc, Ga, Nb, Mo, Sb, Ta and W;

where $z \leq 0.1$; $0.9 \leq \delta \leq 1.1$; $\alpha$, $\beta$, $\gamma$ and $\omega$ are greater than zero; and $(\alpha+\beta+\gamma+\omega)$ is in the range of about 0.75 to 1.1.

22. A piezoelectric material, comprising:

a perovskite material having tetragonal crystal symmetry of the formula, $M_\alpha Bi_\beta M'_\gamma M''_\delta O_{3\pm z}$, where M is one or more of Na, K, Rb and Cs, wherein M comprises at least Na; M' is one or more of Ca, Sr, Ba, Pb, Y, La, Pr, Nd, Sm, Eu, Gd, Th, Dy, Ho, Er, Tm, Yb and Lu; M" is one or more of Ti, Zr, Hf, Sn, Ge, Mg, Zn, Al, Sc, Ga, Nb, Mo, Sb, Ta and W;

where $z \leq 0.1$;

$\alpha+\beta+\gamma+\delta < 2.0$;

$\alpha<\beta$; and $\beta<0.5$.

23. The material of claim 20, 21 or 22, wherein M is Na and/or K; M' is Ba; M" is Ti; and $(\alpha+\beta+\gamma)$ is in the range of about 0.75 to 0.95.

24. The piezoelectric material of claim 23, wherein Ba is present in an amount in the range of about 5.0 to about 6.25%.

25. The piezoelectric material of claim 22, wherein M' is an alkaline earth metal and M" is Ti, and wherein the M/Bi molar ratio is less than one and the (M+Bi+M')/M" molar ratio is less than one.

26. The piezoelectric material of claim 25, wherein the M/Bi ratio is less than about 0.94 and the (M+Bi+M')/M" molar ratio is less than about 0.90.

27. The piezoelectric material of claim 20, 21 or 22, wherein the material is polycrystalline.

28. The piezoelectric material of claim 20, 21 or 22, wherein the material is a single crystallite.

29. The piezoelectric material of claim 1, 2, 20, 21 or 22, wherein the material has a strain actuation of greater than 0.25%.

30. The piezoelectric material of claim 1, 2, 20, 21 or 22, wherein the material has a strain actuation of greater than 0.50%.

31. The piezoelectric material of claim 1, 2, 20, 21 or 22, where the piezoelectric material having an actuation strain of greater than about 0.75%.

32. The piezoelectric material of claim 21, wherein the $d_{33}$ is greater than 300 pC/N.

33. The piezoelectric material of claim 1 or 20, wherein the perovskite material has a formula $Na_\alpha Bi_\beta Ba_\gamma Ti_\delta O_{3\pm z}$, wherein $\alpha$ is in the range of about 0.300–0.546; $\beta$ is in the range of about 0.349–0.486; $\gamma$ is in the range of about 0.027–0.101; and $\delta$ is in the range of about 0.942–1.079.

34. The piezoelectric material of claim 1 or 20, wherein the perovskite material has a formula $Na_\omega K_\alpha Bi_\beta Ba_\gamma Ti_{67} O_{3\pm z}$, wherein $\alpha$ is about 0.07; $\beta$ is about 0.46; $\gamma$ is about 0.08; $\delta$ is about 1.0; and $\omega$ is about 0.39.

35. A single crystal fiber, comprising;

a perovskite material of the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Th, Dy, Ho, Er, Tm, Yb and Lu; M" is one or more of Ti, Zr, Hf, Sn, Ge, Mg, Zn, Al, Sc, Ga, Nb, Mo, Sb, Ta and W;

where $z \leqq 0.1$, $0.9 \leqq \delta \leqq 1.1$; $\alpha$, $\beta$ and $\gamma$ are greater than zero; and $(\alpha+\beta+\gamma)$ is in the range of about 0.75 to 1.1, said material characterized by congruent melting.

36. The single crystal fiber of claim 35, wherein M=Na, M'=Ba, M"=Ti, $\gamma$ is in the range of about 0.05–0.10.

37. A piezoelectric material, comprising:

a perovskite material of the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Th, Dy, Ho, Er, Tm, Yb and Lu; M" is two or more of Ti, Zr, Hf, Sn, Ge, Mg, Zn, Al, Sc, Ga, Nb, Mo, Sb, Ta and W;

where $z \leqq 0.1$; $0.9 \leqq \delta \leqq 1.1$; $\alpha$, $\beta$ and $\gamma$ are greater than zero; $(\alpha+\beta+\gamma)$ is in the range of about 0.75 to 1.1, and $0.32<\beta<0.5$, the piezoelectric material having a $d_{33}$ of greater than about 200 pC/N.

38. The piezoelectric material of claim 37, in which M is Na, M' is Ba and one of the element M" is Ti.

39. A method of preparing a crystallographically oriented array of crystals, comprising:

growing piezoelectric crystals or crystallites under conditions which allow them to express a faceted morphology; and aligning a set of facets and/or edges which is common to all of the crystals or crystallites against a surface or edge, thereby resulting in a crystallographically textured array of crystals, wherein the piezoelectric crystal or crystallites comprises the material of claim 1, 2, 19, 20 or 21.

40. The material of claim 1, wherein $\alpha$, $\beta$, and $\gamma$ are selected such that the single crystal is antiferroelectric prior to the application of an electric field, and such that under an applied electric field, the single crystal transforms to a ferroelectric phase, said transformation being accompanied by a strain of at least 0.1%.

41. The material of claim 40, wherein M=Na, M'=Ba, M"=Ti, and said transformation from antiferroelectric to ferroelectric phase is attained at a temperature of less than about 100° C.

* * * * *

UNITED STATES PATENT AND TRADEMARK OFFICE
CERTIFICATE OF CORRECTION

| | | |
|---|---|---|
| PATENT NO. | : 6,231,779 B1 | Page 1 of 1 |
| APPLICATION NO. | : 09/174981 | |
| DATED | : May 15, 2001 | |
| INVENTOR(S) | : Chiang et al. | |

It is certified that error appears in the above-identified patent and that said Letters Patent is hereby corrected as shown below:

Col. 1, line 3 insert the following:
-- This invention was made with government support under Grant Number N00014-97-1-0989 awarded by the Office of Naval Research and under Grant Number DAAH04-95-1-0104 awarded by the Army Research Office. The government has certain rights in the invention. --

Signed and Sealed this
Twenty-first Day of February, 2012

David J. Kappos
*Director of the United States Patent and Trademark Office*